United States Patent [19]
Ye et al.

[11] Patent Number: 5,798,947
[45] Date of Patent: Aug. 25, 1998

[54] METHODS, APPARATUS AND COMPUTER PROGRAM PRODUCTS FOR SELF-CALIBRATING TWO-DIMENSIONAL METROLOGY STAGES

[75] Inventors: Jun Ye, Palo Alto, Calif.; Roger Fabian Wedgwood Pease, Arlington, Va.; Michael T. Takac, San Jose, Calif.

[73] Assignees: The Board of Trustees of the Leland Stanford, Jr. University, Stanford, Calif.; International Business Machines Corp., Armonk, N.Y.

[21] Appl. No.: 810,537

[22] Filed: Mar. 3, 1997

Related U.S. Application Data

[63] Continuation of Ser. No. 718,922, Sep. 25, 1996, abandoned.
[51] Int. Cl.$^6$ .................................................. G01B 7/00
[52] U.S. Cl. ..................... 361/589; 364/560; 364/571.01
[58] Field of Search ......................... 364/167.01, 474.35, 364/474.34, 559, 560, 571.01–571.08; 356/401, 399, 400, 375, 356, 138–139.04, 388, 395–398; 73/1.75, 1.79

[56] References Cited

U.S. PATENT DOCUMENTS 4,583,298   4/1986   Raugh ......................................... 33/502

OTHER PUBLICATIONS

Takac et al., *Self–Calibration In Two Dimensions: The Experiment*, SPIE Proceedings on "Metrology, Inspection and Process Control for Microlithography X", Santa Clara, California, vol. 2725, Mar. 11–13, 1996, pp. 130–146.

Raugh, *Absolute Two–Dimensional Sub–Micron Metrology For Electron Beam Lithography*, Precision Engineering, 1985, Butterworth & Co (Publishers) Ltd., pp. 3–13.

Kuniyoshi et al., *Stepper Stability Improvement By A Perfect Self–Calibration System*, SPIE vol. 2197, pp. 990–996.

Lawson et al., *Calibration Algorithms For An Electron Beam Metrology System*, Microelectronic Engineering 1 (1983), pp. 41–50.

Takac, *Self–Calibration In One Dimension*, SPIE vol. 2087, Photomask Technology and Management (1993), pp. 80–86.

Raugh, *Absolute 2–D Sub–Micron Metrology For Electron Beam Lithography*, SPIE vol. 480, Intgrated Circuit Metrology II (1984), pp. 145163.

Jun Ye, *Errors in High–Precision Mask Making and Metrology*, Solid State Electronics Laboratory, Semiconductor Research Corporation Contract No. MC–515, Mar. 1996, pp. 1–167.

*Primary Examiner*—James P. Trammell
*Attorney, Agent, or Firm*—Myers Bigel Sibley & Sajovec

[57] ABSTRACT

Methods, apparatus and computer program products for selfcalibrating two-dimensional metrology stages include using a rigid artifact plate having an N×N array of marks thereon to map each of a two-dimensional array of stage positions (u,v) to a corresponding position in a Cartesian coordinate grid (x,y) to determine the distortion functions $G_x(x,y)$ and $G_y(x,y)$. This mapping function is performed by a series of operations which preferably use an orthogonal Fourier series to decouple determination of a pivoting point and a rotation angle from determination of the distortion functions. These operations include, among other things, determining complete and incomplete non-four-fold rotationally symmetric distortion between the two-dimensional array of stage positions (u,v) and the Cartesian coordinate grid (x,y). Operations are then performed to decouple the determination of the pivoting point and the rotation angle from the determination of the distortion functions $G_x(x,y)$ and $G_y(x,y)$ by determining (i) a two-dimensional translation misalignment error and a rotation misalignment error from the complete and incomplete non-four-fold rotationally symmetric distortion and then determining (ii) complete four-fold rotationally symmetric distortion between the two-dimensional array of stage positions and the Cartesian coordinate grid from, among other things, the two-dimensional translation misalignment error and the rotation misalignment error. These operations provide a highly efficient method of self-calibrating metrology and lithography stages.

47 Claims, 7 Drawing Sheets

METHODS, APPARATUS AND COMPUTER PROGRAM PRODUCTS FOR SELF-CALIBRATING TWO-DIMENSIONAL METROLOGY STAGES

This application is a continuation of Ser. No. 08/718,922 filed Sep. 25, 1996, abandoned.

FIELD OF THE INVENTION

This invention relates to metrology and lithography tools, and more particularly to the calibration of metrology and lithography tools used during the fabrication of microelectronic integrated circuits.

BACKGROUND OF THE INVENTION

Two-dimensional (2D) coordinate stages are used in many stages of very-large-scale-integrated (VLSI) circuit fabrication, to position lithography masks and move wafers to predetermined positions with high degrees of reproducibility and accuracy. Typical tools which incorporate 2D-coordinate stages include electron and laser-beam pattern generators in mask making, optical steppers in wafer printing and placement inspection tools in mask metrology.

In conventional photolithographic processing of semiconductor wafers, a plurality of masks are used in sequence to define microelectronic structures and features therein. Of course, in order to ensure that the features produced with a first mask are properly aligned to features produced with a second mask during a subsequent process step, it is typically necessary that the two masks be properly aligned relative to each other and that the mask patterns used to define the features be accurately located on each mask. In the past, the mask making industry faced little technical challenge in meeting the alignment and accuracy challenges posed by semiconductor process designers, even as critical photolithographic linewidths decreased by a factor of ten (10). The ability to meet these early challenges was due, at least in part, to the high resolution and placement accuracy provided by mask pattern generators and the transition in wafer exposure tools from predominantly 1× optical lithography to 5× reduction optical lithography. However, as critical photolithographic linewidth feature sizes continue to shrink, improved techniques and equipment for meeting more precise alignment and accuracy challenges are required.

During fabrication of integrated circuits, a semiconductor wafer is typically mounted on a 2D-coordinate stage. Typically, the (u,v) position and movement of the stage is monitored by a laser-interferometer. As will be understood by those skilled in the art, the measured (u,v) position of the stage will most often contain a deviation from the actual position of the stage in Cartesian coordinates. This deviation is typically referred to as the stage position measurement error. The Cartesian coordinate system has straight and uniform (x,y) grid lines which are orthogonal and have the same scale. As will be understood by those skilled in the art, the stage position measurement error is the sum of (i) random measurement noise (which can be caused by noise in circuitry, mechanical vibration, and air movement, etc.) and (ii) systematic measurement error (which is a function of the stage position, and can arise from, for example, the non-orthogonality between the x-y mirrors, curvature of the mirrors, etc.). The systematic measurement error is also called stage distortion. Accordingly, the proper calibration of 2D-coordinate stages generally requires the determination of the stage distortion by mapping the measured stage position to its respective position in the Cartesian coordinate grid. For example, FIG. 1 illustrates the relationship between the stage distortion functions $G_x(x,y)$ and $G_y(x,y)$ to be determined through calibration, the measured stage positions (u,v) which make up the measurement grid (as shown by the solid lines) and the actual stage positions (x,y) which make up the Cartesian coordinate grid (as shown by the dotted lines).

Most stand-alone apparatus that have 2D-coordinate stages for VLSI processing and testing constitute a 2D-coordinate metrology system (e.g., mask placement inspection tools) or have 2D-metrology capability (e.g., electron-beam pattern generators and optical steppers). When using these apparatus, stage distortion typically manifests itself as a coordinate measurement error when measuring marks having known positions on a rigid artifact plate ("standard plate"). The measurement of marks on a standard plate is a form of conventional calibration typically requiring two steps. The first step measures a standard plate having mark positions that are known to a higher degree of precision than the stage grid. This measurement step is generally performed by recording the nominal x-y coordinates of the stage when each mark of the array is aligned with the axis of the metrology apparatus. The difference between the measured position and the known position of a mark is equivalent to the stage distortion at that mark position. The second step determines a mapping function (stage calibration function) between the measured coordinates and the actual coordinates, using a piece-wise linear function or a polynomial fitting, as an approximation to the actual stage distortion. The mapping function can then be used to mathematically compensate the measured mark positions or develop hardware or software compensation for pattern generators and optical steppers. For those pattern generators that do not constitute a 2D-coordinate metrology system, the calibration can be done by using a calibrated metrology tool to measure a rigid plate which has been produced by the pattern generator. Thus, the calibration of all 2D lithography stages can be achieved directly or indirectly by using a calibrated 2D metrology stage.

Unfortunately, the use of standard plates to calibrate 2D metrology stages is no longer generally feasible because it is difficult to fabricate plates with mark positions at locations known with higher levels of accuracy than the levels obtainable with state-of-the-art metrology tools. To address this fundamental problem, self-calibration techniques have been developed to calibrate metrology stages using artifact plates with an array of mark positions having locations that are not precisely known. Here, the only requirement is that the artifact plate be "rigid" so that the relative positions of the marks on the plate do not change when the plate is rotated or translated on the stage. By measuring the rigid plate by placing it at different locations and orientations on the stage, the stage distortion functions can be determined since, by comparing the different views, the distortion associated with the placement of the marks on the rigid plate can be automatically canceled.

Examples of conventional self-calibration techniques are disclosed in articles by M. R. Raugh entitled *Absolute Two-Dimensional Sub-Micron Metrology for Electron Beam Lithography*, Precision Engineering, No. 7, Vol. 1, pp. 3–13, January (1985) and *Absolute 2D Sub-Micron Metrology for Electron Beam Lithography*, SPIE Proceedings, Vol. 480, pp. 145–163 (1984); and in U.S. Pat. No. 4,583,298 to Raugh entitled *Auto Calibration Method Suitable for Use in Electron Beam Lithography*. In particular, using symmetry arguments, Raugh pointed out some of the conditions for achieving complete self-calibration. Raugh determined that single or multiple rotations of the rigid artifact plate about a single pivoting point coupled with measurement of the marks thereon cannot give complete self-calibration, because any rotationally symmetric distortion will look the same in all measurement views, and hence be undetectable by comparing these views. Similarly, single or multiple translations of the plate in one direction cannot solve the whole problem because translational invariant distortions are undetectable and translations cannot detect x-y scale differences.

However, as shown by Raugh, at least two operations can be performed to achieve complete self-calibration. These operations include a rotational displacement of the plate (for comparing x-y scales) and a translational displacement (or another rotation about a different pivot point) of the plate. Here, two 90° rotations of the plate about the pivot points A and B on the stage, as illustrated by FIG. 2, produce three measurement views. These views include an initial view, the view of the plate when it is rotated 90° about point A and the view of the plate when it is rotated 90° about point B. Thus, for there to be any undetectable distortion by comparing these three views, the distortion must look the same when rotated about either point A or point B. For this to be possible, the distortion must possess four-fold rotational symmetry about both points A and B. As will be understood by those skilled in the art, the undetectable distortion should also look the same when rotated about point AB, as further illustrated by FIG. 2.

Based on this approach, it was determined that the undetectable distortion will also possess four-fold rotational symmetry about all of the lattice sites generated by the initial pivoting point pair (A, B). As illustrated by FIG. 3, these lattice sites form a 2D array of lattice sites, typically referred to as a "pivoting point lattice" (PPL). There are only three (3) types of discrete PPLs for which the problem of undetectable distortion is present when rotation and translation operations are performed. These three PPLs include the square PPL illustrated by FIG. 3 and the triangular and hexagonal PPL (not shown). However, if the PPL is dense (i.e., there are an infinite number of lattice sites inside any small area), the undetectable distortion will be constant and therefore will not change when rotated about any point on the stage. Yet, a constant "distortion" is not a distortion in the true sense which means that if the PPL is dense, all stage distortion including four-fold rotationally symmetric distortion can be determined. According to Raugh, complete self-calibration can be achieved if three conditions are met: (1) there must be at least three different measurement views, (2) the pivoting points must be at different stage locations and (3) the lattice generated by the initial pivoting point pair must be dense.

Raugh also assumed that the stage distortion functions $G_x(x,y)$ and $G_y(x,y)$ could be expressed by a finite polynomial and devised an algorithm based on a nonlinear least-square minimization in a parameter space. To address the fact that an exact 90° rotation about an exactly specified pivoting point can never be realized and an exactly known translation can never by achieved, Raugh also combined the computations of the exact pivoting point and rotation angle together with the computation of the distortion functions. However, this algorithm was computationally expensive because it was nonlinear and possibly unstable in the presence of large random measurement noise.

Accordingly, notwithstanding the above described methods of calibrating two-dimensional metrology stages, there continues to be a need for improved methods and apparatus for performing complete self-calibration of metrology stages, but which do not involve excessive computational expense.

SUMMARY OF THE INVENTION

It is therefore an object of the present invention to provide improved methods, apparatus and computer program products for calibrating two-dimensional metrology or lithography stages.

It is another object of the present invention to provide methods, apparatus and computer program products for efficiently self-calibrating metrology and lithography stages.

It is a further object of the present invention to provide methods, apparatus and computer program products for exactly calibrating metrology and lithography stages when there is no random measurement error.

These and other objects are provided, according to the present invention, by methods, apparatus and computer program products for self-calibrating two-dimensional metrology and lithography stages by mapping each of a two-dimensional array of stage positions (u,v) to a corresponding position in a Cartesian coordinate grid (x,y) to determine distortion therebetween. This mapping function is performed by a series of operations which preferably use an orthogonal Fourier series to decouple the determination of a pivoting point and a rotation angle from the determination of the distortion functions $G_x(x,y)$ and $G_y(x,y)$. In particular, according to the present invention, the operations for performing self-calibration of two-dimensional stages include providing a rigid artifact plate having a two-dimensional N×N array of marks thereon at spaced intervals, on the stage, and then measuring the location of each of the marks on the artifact plate while the plate is maintained in an origin reference location.

The artifact plate is then rotated ±90° to a rotated reference location on the stage and then the locations of the marks are again measured. An operation is then performed to determine complete non-four-fold rotationally symmetric distortion between the two-dimensional array of stage positions (u,v) and the Cartesian coordinate grid (x,y), from the measured locations of the marks in the origin and rotated reference locations.

An operation is also performed to translate the artifact plate at least one interval relative to the origin reference location to dispose the plate in a translated reference location. Once this operation has been performed, the locations of an N×N–1 (or N–1×N–1) array of marks on the plate are measured and these measurements are then used in conjunction with the measured locations of the marks from the origin reference location, to determine incomplete non-four-fold rotationally symmetric distortion between the two-dimensional array of stage positions (u,v) and the Cartesian coordinate grid (x,y). Operations are then performed to decouple the determination of the pivoting point and the rotation angle from the determination of the distortion functions $G_x(x,y)$ and $G_y(x,y)$ by determining (i) a two-dimensional translation misalignment error and a rotation misalignment error from the complete and incomplete non-four-fold rotationally symmetric distortion and then determining (ii) complete four-fold rotationally symmetric distortion between the two-dimensional array of stage positions and the Cartesian coordinate grid from the two-dimensional translation misalignment error, the rotation misalignment error and the measured locations of the marks in the origin, rotated and translated reference locations.

These operations are preferably performed by a computer-controlled metrology apparatus comprising a movable stage adapted for receiving a rigid artifact plate, having a two-dimensional array of marks thereon at spaced intervals which form an (x,y) grid, on a surface of the stage. Means, preferably comprising a software-controlled general purpose computer or dedicated hardware containing application-specific integrated circuits (ASICs) or combinations thereof coupled to the stage, is also provided for positioning the stage in the two-dimensional array of stage positions while the artifact plate is maintained on the surface in an origin reference location, a rotated reference location and a translated reference location. This means also controls the necessary operations for measuring the location of each of the marks on the artifact plate while the artifact plate is maintained in the aforementioned locations, using conventional measurement hardware.

From the measured locations, the general purpose computer or dedicated hardware determines complete non-four-fold rotationally symmetric distortion and incomplete non-four-fold rotationally symmetric distortion between the two-dimensional array of stage positions (u,v) and the Cartesian coordinate grid (x,y). A two-dimensional translation misalignment error and rotation misalignment error are then determined, using linear operations, from differences between the complete and incomplete non-four-fold rotationally symmetric distortion. The distortion functions $G_x(x,y)$ and $G_y(x,y)$ are then determined using linear operations. These linear operations include determining complete four-fold rotationally symmetric distortion between the two dimensional array of stage positions and the Cartesian coordinate grid, from the previously determined rotation and translation misalignment errors and the measured locations of the marks. The complete four-fold rotationally symmetric distortion is then combined with the complete non-four-fold rotationally symmetric distortion to obtain the total distortion which is represented by the distortion functions: $G_x(x,y)$, $G_y(x,y)$.

These linear operations provide a highly efficient method of self-calibrating metrology and lithography stages by decoupling the determination of a pivoting point and rotation angle from the determination of the distortion functions $G_x(x,y)$ and $G_y(x,y)$. When there is no random measurement error, such as caused by circuitry noise, mechanical vibration of the stage and air fluctuation, the operations can exactly determine the complete stage distortion at the sites established by the mark array on the rigid artifact plate. However, in the presence of random measurement noise, the operations may limit the calibration error to about the same magnitude as the random measurement error itself, which is the theoretical best case limit of any methodology for calibrating stages.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
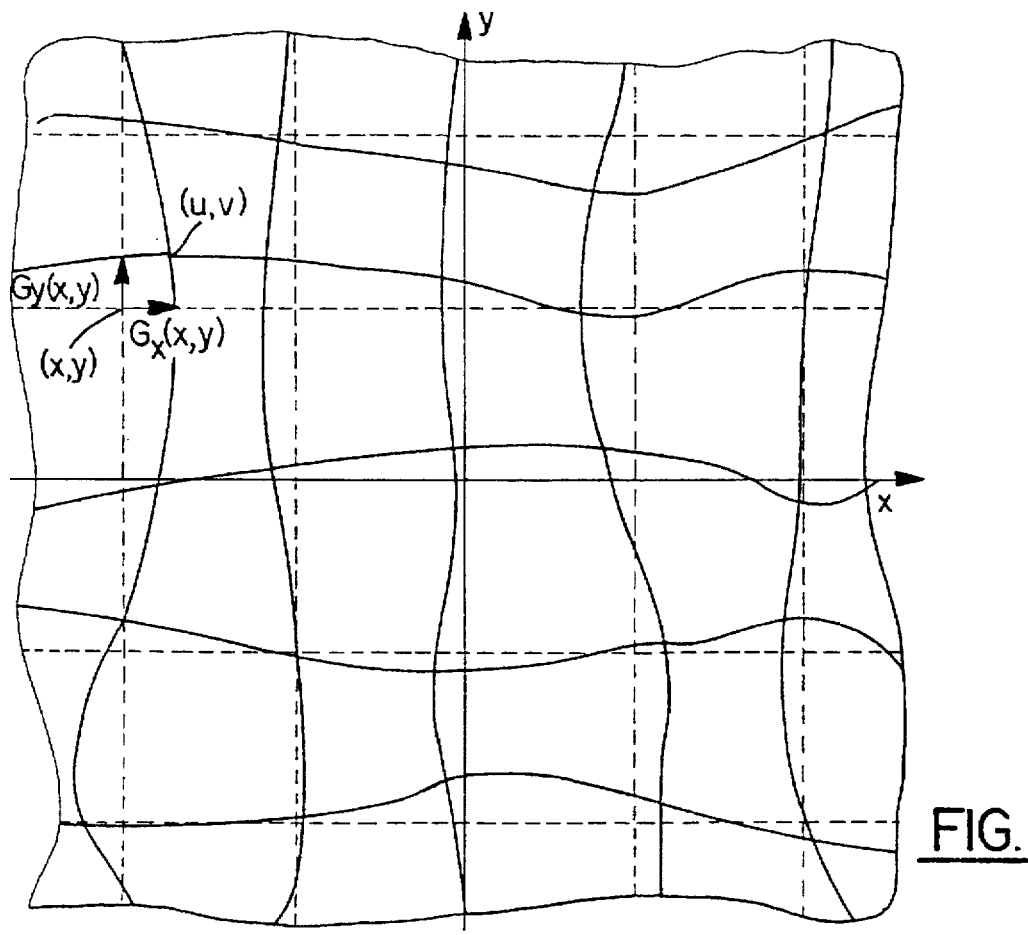
FIG. 1 graphically illustrates stage distortion functions $G_x(x,y)$ and $G_y(x,y)$ as deviations between a Cartesian coordinate grid (x,y) and measured positions (u,v) of a two-dimensional movable stage.
Figure 2:
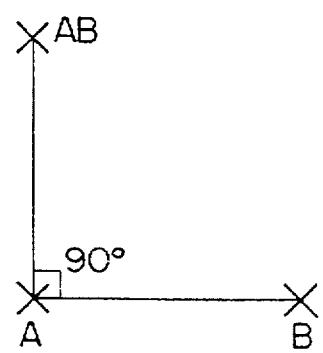
FIG. 2 illustrates a pair of pivot points A,B on a stage and the point AB which represents the location of point B when rotated 90° about point A
Figure 3:
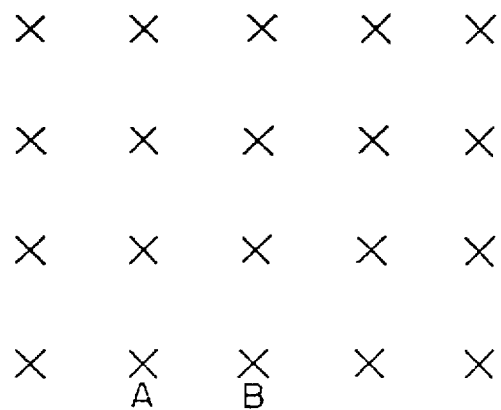
FIG. 3 illustrates a square pivoting point lattice (PPL) generated by the two 90° rotation pivot points A and B of FIG. 2.
Figure 4:
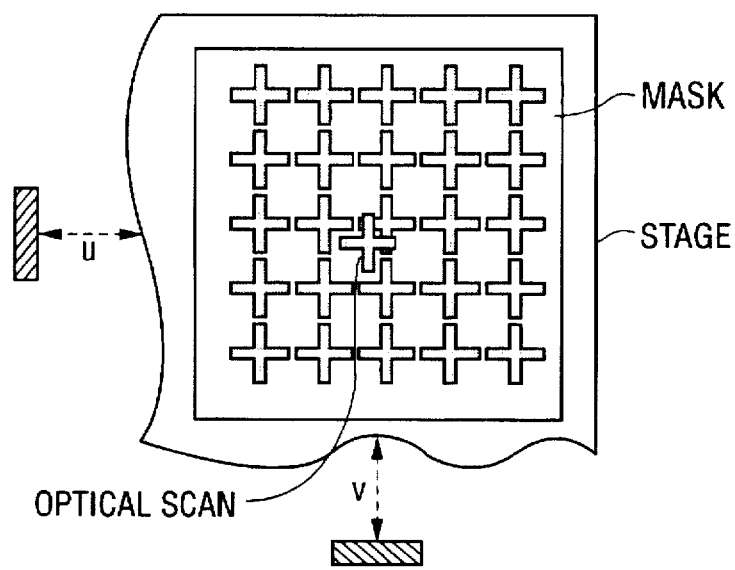
FIG. 4 pictorially illustrates stage distortion associated with a mask metrology tool where the curved lines (u,v) represent the measured positions of a stage containing a mask with a two-dimensional array of marks thereon.

As described in the foregoing sections, the goal of complete self-calibration is to determine the stage distortion functions $G_x(x,y)$ and $G_y(x,y)$ on the continuous stage space. As illustrated by FIGS. 1 and 4, the stage distortion functions represent the deviation between a stage's actual positions (x,y) in Cartesian coordinates and the stage's measured positions (u,v) which may be determined using laser-interferometers or other conventional equipment. For example, FIG. 4 schematically illustrates the stage distortion associated with a conventional mask pattern placement metrology tool, such as the Leica LMS2020 optical metrology tool. Here, when the stage is being translated continuously in the x-direction without any actual movement in the y-direction, any mirror curvature will cause the laser-interferometer to measure apparent movement in the y-direction. Thus, the laser-interferometer measured positions (u,v) (as shown by the curved lines) will deviate from the stage's actual positions (x,y) in Cartesian coordinates.

However, because only a sample of the continuous space can be evaluated using a rigid artifact plate having a two-dimensional array of discrete marks thereon at spaced intervals, the practical goal of self-calibration is to achieve an exact self-calibration with respect to discrete sample sites and then use an approximation method, such as an interpolation method, to approximate the stage distortion between the sites. To optimize the efficiency of the operations necessary for performing self-calibration, a rigid artifact plate having a mark array comprising a square N×N pivoting point lattice (PPL) of marks is preferably employed. As described more fully hereinbelow, the artifact plate can then be easily rotated 90° and translated to establish the necessary views for performing complete self-calibration.

Figure 5:
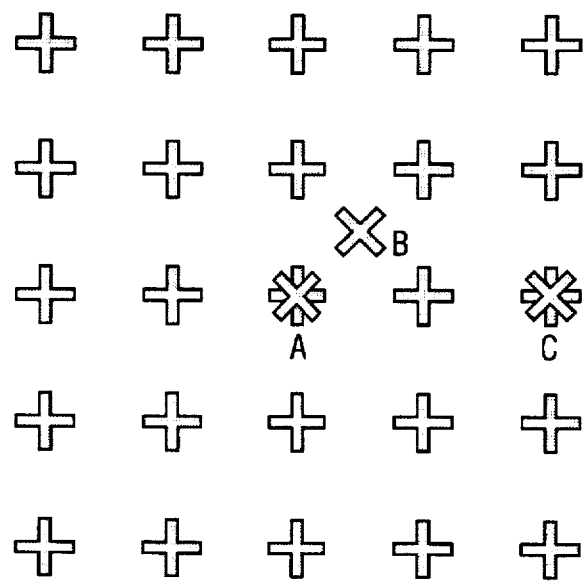
FIG. 5 illustrates a square pivoting point lattice (PPL) with three potential pivot points (A,B,C) which satisfy the requirement that a 90° rotation of the PPL about the pivot point will cause the PPL to rotate onto itself.

An initial requirement to achieve complete self-calibration is that the sample site array must be capable of rotating into itself because for purposes of exact self-calibration the distortion between the sites is not initially determined. To meet this requirement, the two-dimensional mark array on the artifact plate may be square, with the x-intervals and y-intervals being equal. As described more fully hereinbelow, this requirement also restricts the pivot points to be either on the sample sites, or at the diagonal centers between sites, as illustrated best by FIG. 5, where "+" represents a mark on the artifact plate and "x" represents possible pivot points A, B and C. As will be understood by those skilled in the art, because an exact 90° rotation about a precisely specified pivot point is difficult, it may not be possible to precisely rotate the array of sample sites into itself. However, so long as the deviation between the sites in the original and rotated views is small enough so that the stage distortion between the views is negligible, the initial requirement can be satisfied. For example, the spacing between the sample sites is typically on the order of about 1 cm and the deviation between the sites in the original and rotated views can easily be controlled to be less than about 0.2 mm.

Figure 6:
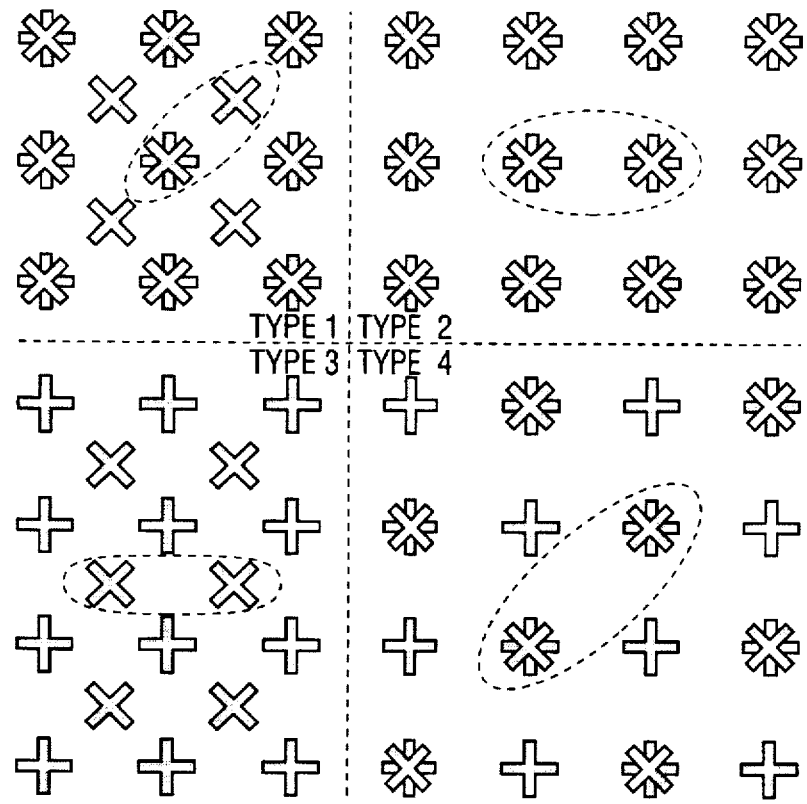
FIG. 6 illustrates four types of pivot point pairs which meet both requirements for achieving self-calibration including the first requirement that a 90° rotation of the PPL about the pivot point will cause the PPL to rotate onto itself and the second requirement that all distortions at every site in the lattice be detectable.
Figure 7:
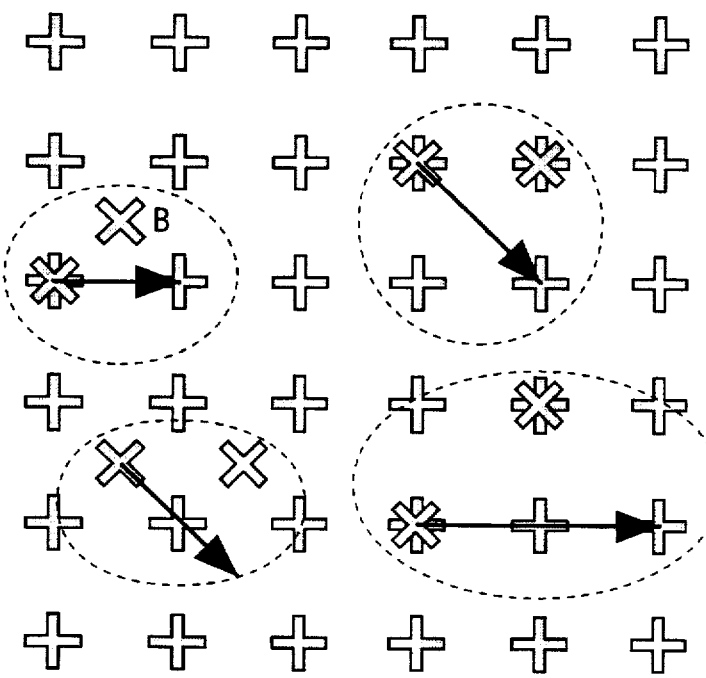
FIG. 7 illustrates four different combinations of pivot points and translations which can be used to achieve exact self-calibration.

However, not all pairs of pivot points that meet the initial requirement will give an exact calibration on all sample sites. To achieve an exact calibration, the distortions on the sample sites must be completely detectable which means that the sample sites must be located at the zeros of the undetectable distortions. As determined by the inventors herein, this requirement is satisfied if the pivot point pairs are selected to be: (1) a sample site and one of its four nearest neighbor diagonal centers; (2) two nearest neighbor sample sites; (3) two nearest neighbor diagonal centers; or (4) two second nearest neighbor sample sites, as illustrated by FIG. 6. Thus, for all four cases, the pivot points are either on the sample sites or at the diagonal centers of the sample sites which make up the PPL. Yet, the relationship between two 90° rotated views with different pivot points, such as a sample site and one of its four nearest neighbor diagonal centers, is equivalent to a single translation, as illustrated by FIG. 7. Therefore, as an alternative to two rotations about a pair of pivot points, a combination of one rotation about a single pivot point and one translation will suffice. In particular, FIG. 7 illustrates four different types of rotation and translation combinations that can be used to yield an exact self-calibration on the discrete sample sites. These include: (1) a pivot point on a sample site or at a diagonal center and one sample interval translation in ±x or ±y; (2) a pivot point on a sample site and one sample interval translation in both x and y (diagonal translation); (3) a pivot point on a diagonal center and one sample interval translation in both x and y (diagonal translation); and (4) a pivot point on a sample site and two sample interval translations in ±x or ±y.

Notwithstanding these constraints for achieving exact self-calibration of metrology stages using rigid artifact plates, complications typically arise from the fact that an exact translation of an integer interval size with absolutely no rotation cannot be practically achieved. Because of this complication, some prior art attempts, including those by Raugh, combined the determination of an exact pivot point and rotation angle together with the computation of the distortion functions. However, the present inventors recognized that coupling the determination of the pivot point, the rotation angle and the distortion functions together can render exact self-calibration operations, such as those proposed by Raugh, nonlinear and numerically undesirable.

Accordingly, as will now be described the present invention performs self-calibration of two-dimensional metrology and lithography stages by mapping each of a two-dimensional array of stage positions (u,v) to a corresponding position in a Cartesian coordinate grid (x,y) to determine distortion therebetween, using a series of linearized operations which preferably implement an orthogonal Fourier series to decouple the determination of a pivoting point and rotation angle from the determination of the distortion functions $G_x(x,y)$ and $G_y(x,y)$.

Figure 8:
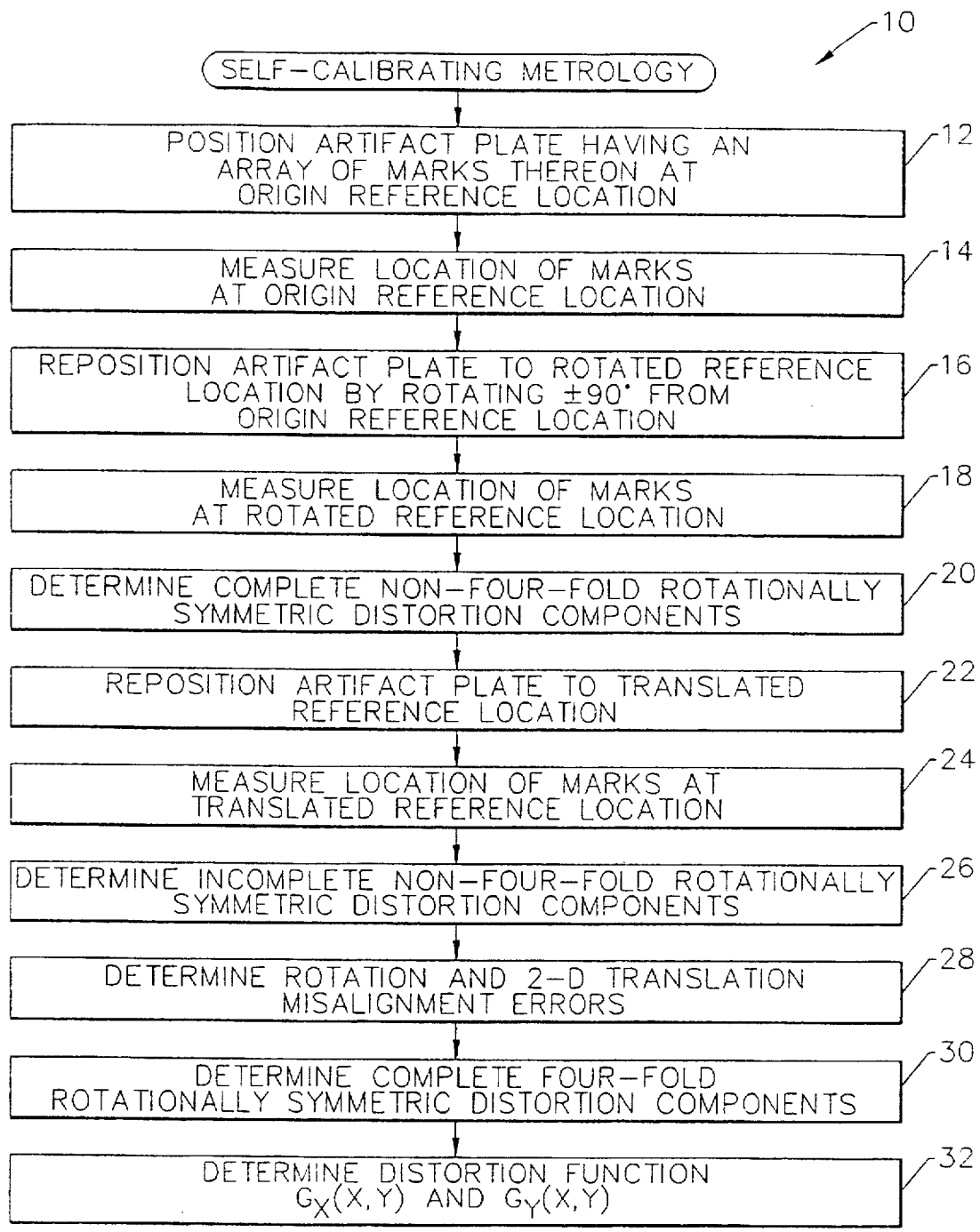
FIG. 8 illustrates operations performed by the self-calibrating metrology tool according to the present invention.
Figure 9:
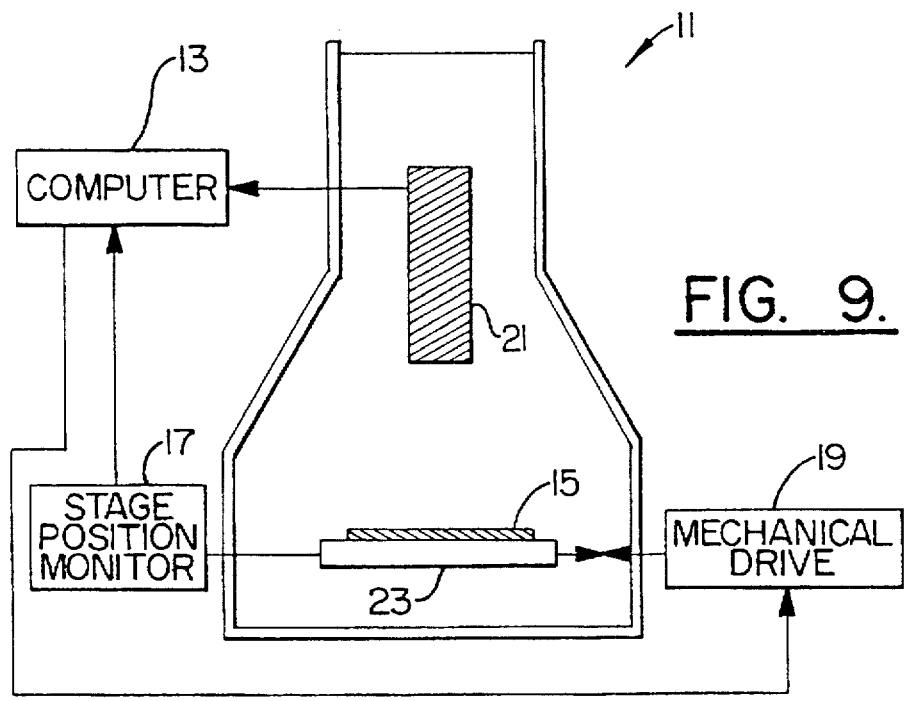
FIG. 9 illustrates an apparatus for calibrating a two-dimensional metrology stage according to an embodiment of the present invention.

In particular, as illustrated by FIGS. 8–9, the self-calibrating metrology tool 11 according to the present invention calibrates itself under control from a computer 13 using a rigid artifact plate 15 having a two-dimensional N×N array of marks thereon at spaced intervals. The self-calibrating metrology operations 10 commence by positioning the artifact plate on an upper surface of the metrology tool's movable stage 23, Block 12. Here, the plate 15 is preferably positioned in a central origin reference location on the stage so that the x-axis and y-axis of the grid of marks on the plate correspond with the respective x-axis and y-axis of movement of the stage. The location of each of the marks in the N×N array are then measured by repeatedly adjusting the position of the stage with a mechanical driver 19 so that each of the marks on the plate pass under an optical scanner 21, for example, which detects the presence of the marks, Block 14. Upon detection, a conventional measurement tool 17 such as a laser-interferometer determines the position (u,v) of the stage 23 for each of the marks. These measurements are then recorded by the computer 13 which is electrically coupled to the stage 23.

The artifact plate 15 is then repositioned to a rotated reference location by rotating the plate ±90° relative to the origin reference location, Block 16, and then remeasuring and recording the position of each of the marks in the rotated reference location, Block 18. As illustrated best by Block 22, the artifact plate 15 is repositioned again to a translated reference location which may be: (i) a one sample site interval translation in ±x or ±y relative to the origin reference location which is most preferred, (ii) a one sample site interval translation in both x and y (diagonal translation) relative to the origin reference location, or (iii) a two (2) sample site interval translation in ±x or ±y relative to the origin reference location. The position of each of the marks in an N×N−1 (or N−1×N−1 or N×N−2) array is then remeasured and recorded, Block 24.

As represented by Block 20, the repositioning and measurement operations (Blocks 22–24) may be performed before, simultaneously with or after the operations for determining the complete non-four-fold rotationally symmetric distortion components of $G_x(x,y)$ and $G_y(x,y)$ from the measured locations of the marks in the origin (View 0) and rotated (View 1) reference locations. An exemplary and most preferred method for determining complete non-four-fold rotationally symmetric distortion is described more fully hereinbelow, however other less preferred and potentially more computationally expensive techniques, as would be understood by those skilled in the art, may be used.

Referring now to Block 26, operations are then performed to determine incomplete non-four-fold rotationally symmetric distortion components between the two-dimensional array of stage positions (u,v) and the Cartesian coordinate grid (x,y), from the measured locations of the marks in the origin (View 0) and translated (View 2) reference locations.

Referring now to Block 28, a rotation misalignment error and a two-dimensional translation misalignment error are then determined in a linearized manner based on differences between the incomplete non-four-fold rotationally symmetric distortion components and the complete non-four-fold rotationally symmetric distortion components. As will be understood by those skilled in the art, non-zero differences between the incomplete and complete non-four-fold rotationally symmetric distortion components will only be present if rotation and translation misalignment errors actually occur. In other words, in the unlikely event the artifact plate 15 can be repositioned in View 2 without the presence of any misalignment error relative to the origin reference location, then the differences between the incomplete and complete non-four-fold rotationally symmetric distortion components will be zero.

Referring now to Blocks 30–32, the two-dimensional translation and rotation misalignment errors (Block 28) and measured locations of the marks in Views 0–2 (Blocks 14, 18 and 24) are then used to determine the complete four-fold rotationally symmetric distortion components between the two-dimensional array of measured stage positions (u,v) and the Cartesian coordinate grid (x,y). The most preferred technique for determining complete four-fold rotationally symmetric distortion is also described more fully hereinbelow, however other less preferred and potentially more computationally expensive techniques, as would be understood by those skilled in the art, may be used. The stage distortion functions $G_x(x,y)$ and $G_y(x,y)$ are then determined, Block 32, from the complete non-four-fold rotationally symmetric distortion components (Block 20) and the complete four-fold rotationally symmetric distortion components (Block 30).

As will be understood by those skilled in the art, the operations illustrated by FIG. 8 may be performed by means which preferably comprises a software-controlled general purpose computer 13 or dedicated hardware containing application-specific integrated circuits (ASICs) coupled to the stage 23. Accordingly, the computer 13 may take the form of an entirely hardware embodiment, an entirely software embodiment or an embodiment combining software and hardware components. A computer program product on a computer-readable storage medium may also be provided having program code means therein for controlling the operations of the computer 10. Here, any suitable medium may be utilized including hard disks, CD-ROMs and other optical and magnetic storage devices.

In particular, the computer 13 preferably controls the necessary operations for measuring the location of each of the marks on the artifact plate 15 using a laser interferometer, for example, while the artifact plate 15 is maintained in the aforementioned origin, rotated and reference locations. From the measured locations, the computer 13 determines complete non-four-fold rotationally symmetric distortion and incomplete non-four-fold rotationally symmetric distortion between the two-dimensional array of stage positions (u,v) and the Cartesian coordinate grid (x,y). A two-dimensional translation misalignment error and rotation misalignment error are then determined by the computer 13, using linear operations, based on differences between the complete and incomplete non-four-fold rotationally symmetric distortion. The distortion functions $G_x(x,y)$ and $G_y(x,y)$ are then determined using additional linearized operations. These linearized operations include determining complete four-fold rotationally symmetric distortion between the two dimensional array of stage positions and the Cartesian coordinate grid, from the previously determined rotation and translation misalignment errors and the measured locations of the marks. The complete four-fold rotationally symmetric distortion is then combined with the complete non-four-fold rotationally symmetric distortion to obtain the total distortion.

As developed more fully hereinbelow, the linearized operations of FIG. 8 provide a highly efficient method of self-calibrating metrology and lithography stages by preferably using an orthogonal Fourier series to decouple the determination of a pivoting point and rotation angle from the determination of the distortion functions $G_x(x,y)$ and $G_y(x,y)$. When there is no random measurement error, such as caused by circuitry noise, mechanical vibration and/or air fluctuation, the operations can exactly determine the complete stage distortion at the sites established by the mark array on the rigid artifact plate 15. However, in the presence of random measurement noise, the operations may limit the calibration error to about the same magnitude as the random measurement error itself, which is the theoretical best case limit of any methodology for calibrating 2D-coordinate metrology systems.

Figure 10:
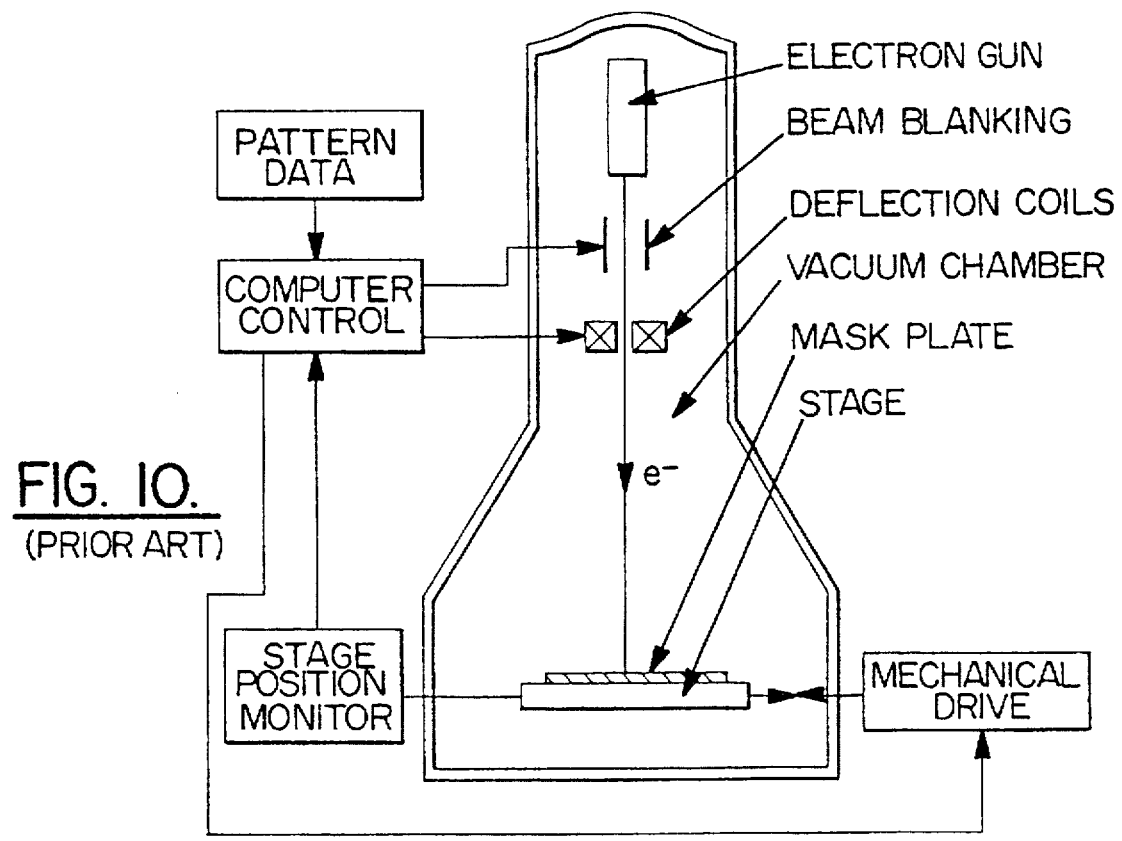
FIG. 10 is a hardware schematic description of an electron-beam pattern generator according to the prior art.
Figure 11A:
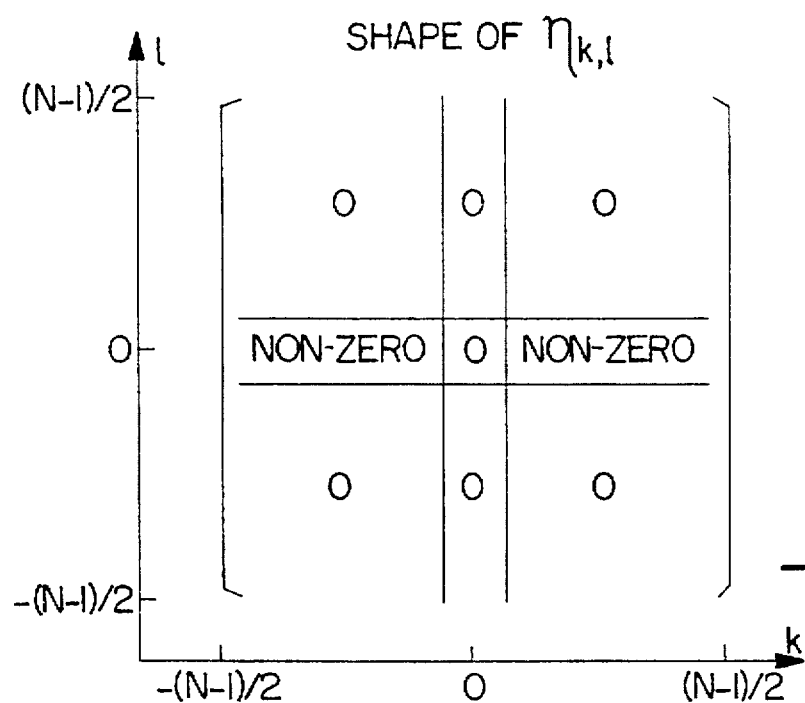
FIGS. 11a–d illustrate the shape of four matricies $\eta_{k,l}$, $\sigma_{k,l}$, $\tau_{k,l}$, $\gamma_{k,l}$ described in equations 69a–c.
Figure 11B:
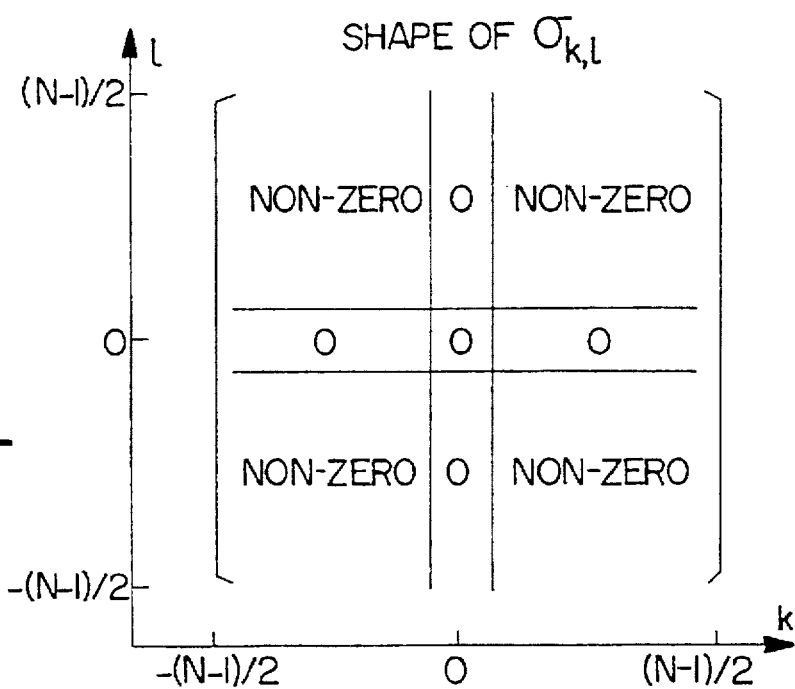
Figure 11C:
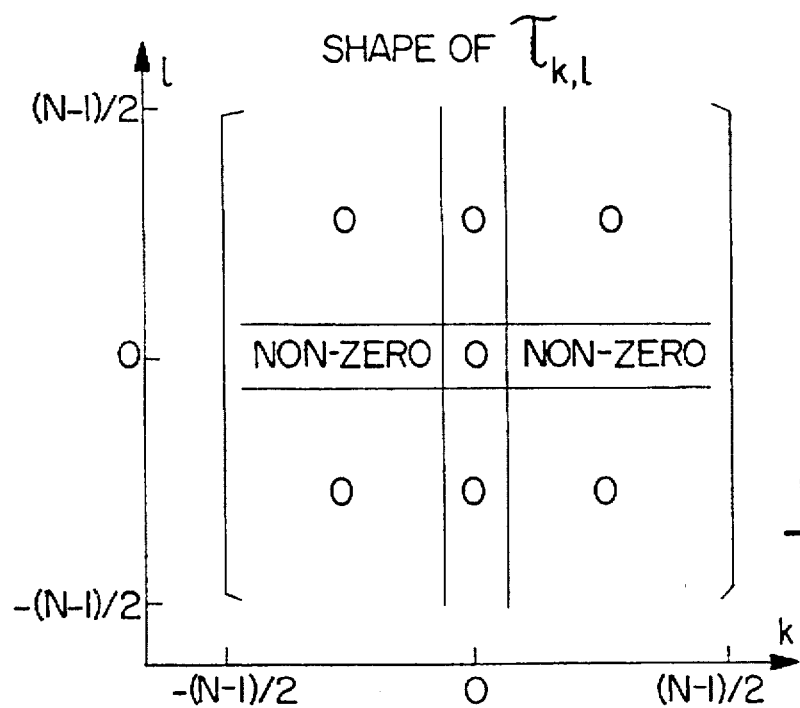
Figure 11D:
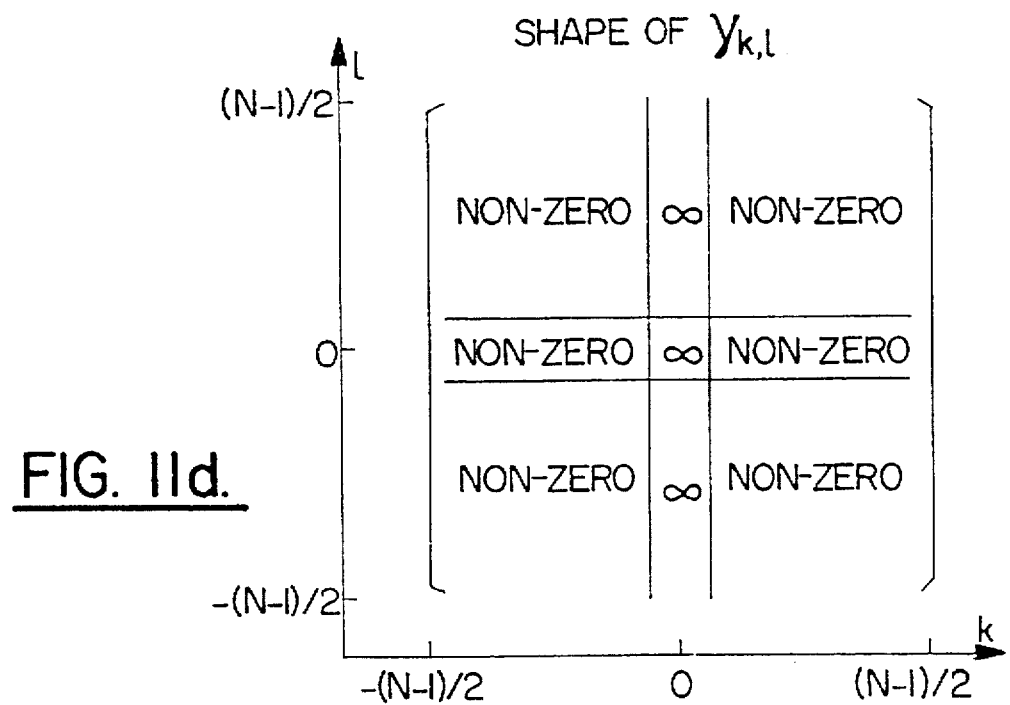

For those pattern generators that do not constitute 2D-coordinate metrology systems, the above calibration operations illustrated by FIG. 8 can be performed by a calibrated metrology tool to measure and calibrate rigid plates which have been produced by these pattern generators. A schematic of an exemplary pattern generator, such as an electron beam mask pattern generator, is illustrated by FIG. 10. The electron beam mask pattern generator typically contains four major subsystems including the electron beam column, the movable stage, the computer control system and the mechanical system. Laser mask pattern generators are similar to the illustrated electron beam mask pattern generator, however the electron beam column is replaced with a laser beam column.

To pattern a mask it is typically necessary to deflect the electron beam (e) over the entire area of the mask. However, because of limits associated with conventional electromagnetic deflection coils, it is typically difficult to deflect the electron beam over the entire mask area without incurring significant pattern errors. These limitations typically require that the electron beam scan size be on the order of only about a few millimeters or less and that the two-dimensional stage be mechanically driven through the deflection field of the electron beam. The movable stage can be operated in a step-and-repeat mode in which a field containing a portion of an integrated circuit, for example, is exposed by deflecting the electron-beam over the field while the stage is stationary. The stage is then stepped to an adjacent field and then another portion of the integrated circuit is exposed. These operations are continued until the entire mask has been exposed. The correct positioning of the stage is critical for pattern placement or abutment of adjacent patterns and is typically controlled by the stage position monitor which preferably contains a laser interferometer for measuring distance between a fixed mirror and a movable stage mirror.

Calibration of the pattern generator can preferably be achieved by patterning a mask not as an integrated circuit but as a rigid artifact plate having a two-dimensional array of marks thereon and then using the patterned artifact plate in a calibrated metrology system, such as the one illustrated by FIG. 9, to indirectly calibrate the pattern generator. Here, the distortion functions $G_x(x,y)$ and $G_y(x,y)$ can be used as a direct measurement of the distortion associated with the patterned mask containing the mark array and therefore as an indirect measurement of the stage distortion associated with the pattern generator. Thus, the calibration of all 2D lithography stages can at least be achieved indirectly using a calibrated 2D metrology stage.

In the foregoing sections, a thorough and complete description of a preferred embodiment of the present invention has been provided which would enable one of ordinary skill in the art to make and use the same. However, a detailed mathematical treatment of the above described operations will now be provided to further assist one of ordinary skill in the art in readily reducing the preferred embodiment to practice. In particular, the above described operations may be performed in real space by determining discrete sample site distortion, for example, or in Fourier transform space by determining discrete Fourier transform coefficients. In the latter methodology which is less prone to noise, the orthogonality between the Fourier bases decouples the expansion coefficients and allows operations to be performed using these decoupled coefficients as discrete variables. Here, the orthogonal Fourier bases can be used at least in part because the array of marks on the artifact plate is spatially uniformly distributed. The operations for performing self-calibration using a preferred orthogonal Fourier series to decouple the determination of a pivoting point and rotation angle from the determination of the distortion functions $G_x(x,y)$ and $G_y(x,y)$ and to determine the complete four-fold and non-four-fold rotationally symmetric distortion components in a linearized manner, will now be provided.

For a metrology tool, $\overline{G}(x,y)$ is the systematic measurement error at $(x,y)$, where $(x,y)$ is the location of the sample site in the Cartesian coordinate grid. $\overline{G}(x,y)$, which is graphically illustrated by FIG. 1, is typically on the order of about 0.05 μm for state-of-the art metrology stages. For purposes of illustration herein, the field to be calibrated has an area of L×L where L is in a range between about 10 to 20 cm. The origin of the x-y axis is chosen at the center of this area. So:

$$\overline{G}(x, y) = G_x(x, y)\overline{e}_x + G_y(x, y)\overline{e}_y \quad (1)$$

where $\overline{e}_x$ and $\overline{e}_y$ are the unit vectors of the stage axis. $G_x(x,Y)$ and $G_y(x,y)$ are functions on the continuous 2D field L×L. The practical goal of self-calibration is to obtain an exact calibration on discrete sample sites, and then use an interpolation method to approximate $\overline{G}(x,y)$ between the sites. Here, the sample sites are in an N×N square array covering the field L×L (N is often between 10 and 20). For notation simplicity, the system is developed where N is odd. (For the case where N is even, the modification is straight forward, but the equation appearance will be slightly changed.) In the Cartesian grid the sample sites are:

$$x = m\Delta \quad (2a)$$

$$y_n = n\Delta \quad (2b)$$

where: $m = -(N-1)/2 \ldots (N-1)/2$, $n = -(N-1)/2 \ldots (N-1)/2$, and $$\Delta = \frac{L}{N}$$

which is called sample site interval. The following notation is used for notational simplicity:

$$G_{x,m,n} \equiv G_x(x_m, y_n) \quad (3a)$$

$$G_{y,m,n} \equiv G_y(x_m, y_n) \quad (3b)$$

$$\overline{G}_{m,n} \equiv G_{x,m,n}\overline{e}_x + G_{y,m,n}\overline{e}_y \quad (3c)$$

In the present example, $\overline{G}_{m,n}$ has three properties:

Property I: $\overline{G}_{m,n}$ has no translation. A translation is not a physical distortion, but due to the choice of the axis origin. The axis origin is chosen so that no translation exists in $\overline{G}_{m,n}$. So:

$$\sum_{m,n} G_{x,m,n} = 0 \quad (4a)$$

$$\sum_{m,n} G_{y,m,n} = 0 \quad (4b)$$

where the summation runs over $m = -(N-1)/2 \ldots (N-1)/2$, and $n = -(N-1)/2 \ldots (N-1)/2$ Property II: $\overline{G}_{m,n}$ has no rotation. A rotation is not a physical distortion, but due to the choice of the axis orientation. The axis orientation is chosen so that no rotation exists in $\overline{G}_{m,n}$.

The rotation angle in $\overline{G}_{m,n}$ is the angle that a back rotation will minimize the $\overline{G}_{m,n}$ in a least squares sense. A counter-clockwise rotation $\theta$ about the axis origin will add a deviation $\overline{E}_{\theta,m,n}$ to $\overline{G}_{m,n}$:

$$\overline{E}_{\theta,m,n} = \theta \overline{e}_z \times (x_m \overline{e}_x + y_n \overline{e}_y) = -\theta y_n \overline{e}_x + \theta x_m \overline{e}_y$$

where the approximation of small angles was used. The approximation of small angle will be used throughout this example. The counter-clockwise rotation $\theta$ in $\overline{G}_{m,n}$ satisfies:

$$\frac{d}{d\theta} \sum_{m,n} |\overline{G}_{m,n} - \overline{E}_{\theta,m,n}|^2 = 0$$

which yields:

$$\theta = \frac{\sum_{m,n} (G_{y,m,n} x_m - G_{x,m,n} y_n)}{\sum_{m,n} (x_m^2 + y_n^2)} \quad (5)$$

But $\theta = 0$, therefore:

$$\sum_{m,n} (G_{y,m,n} x_m - G_{x,m,n} y_n) = 0 \quad (6)$$

A dimensionless parameter 'O' is defined which is the x-y non-orthogonality in $\overline{G}_{m,n}$:

$$O = \frac{\sum_{m,n} (G_{y,m,n} x_m - G_{x,m,n} y_n)}{\sum_{m,n} (x_m^2 + y_n^2)} \quad (7)$$

Property III: $\overline{G}_{m,n}$ has no magnification. A magnification is not a physical distortion, but due to the choice of the stage grid scale. A scale was chosen where no magnification exists in $\overline{G}_{m,n}$. (The scale can be later calibrated to match any national or international standard.)

The magnification in $\overline{G}_{m,n}$ is the magnification that a corresponding de-magnification will minimize the $\overline{G}_{m,n}$ in the least squares sense. A magnification 'M' adds a deviation $\overline{E}_{M,m,n}$ to $\overline{G}_{m,n}$:

$$\overline{E}_{M,m,n} = M(x_m \overline{e}_x + y_n \overline{e}_y) = M x_m \overline{e}_x + M y_n \overline{e}_y$$

So, the magnification M in $\overline{G}_{m,n}$ satisfy:

$$\frac{d}{dM} \sum_{m,n} |\overline{G}_{m,n} - \overline{E}_{M,m,n}|^2 = 0$$

which yields:

$$M = \frac{\sum_{m,n} (G_{x,m,n} x_m + G_{y,m,n} y_n)}{\sum_{m,n} (x_m^2 + y_n^2)} \quad (8)$$

But M=0, therefore:

$$\sum_{m,n} (G_{x,m,n} x_m + G_{y,m,n} y_n) = 0 \quad (9)$$

Another dimensionless parameter 'R' is defined which is the x-y scale difference in $\overline{G}_{m,n}$:

$$R = \frac{\sum_{m,n} (G_{x,m,n} x_m - G_{y,m,n} y_n)}{\sum_{m,n} (x_m^2 + y_n^2)} \quad (10)$$

The calibration can therefore be accomplished in two steps: (1) find the first order components O and R, (2) find the residual distortion $\overline{F}_{m,n}$ in $\overline{G}_{m,n}$ after O and R, where:

$$G_{x,m,n} = Oy_n + Rx_m + F_{x,m,n} \quad (11a)$$

$$G_{y,m,n} = Ox_m - Ry_n + F_{y,m,n} \quad (11b)$$

Substitute (11) back into (4,6,7,9,10), and note that the origin of x and y axis is the center of the sample array, which yields the following properties of $\overline{F}_{m,n}$:

(1) No translation:

$$\sum_{m,n} F_{x,m,n} = 0 \quad (12a)$$

$$\sum_{m,n} F_{y,m,n} = 0 \quad (12b)$$

(2) No rotation:

$$\sum_{m,n} (F_{y,m,n} x_m - F_{x,m,n} y_n) = 0 \quad (13)$$

(3) No non-orthogonality:

$$\sum_{m,n} (F_{y,m,n} x_m + F_{x,m,n} y_n) = 0 \quad (14)$$

(4) No magnification:

$$\sum_{m,n} (F_{x,m,n} x_m + F_{y,m,n} y_n) = 0 \quad (15)$$

(5) No x/y-scale-difference:

$$\sum_{m,n} (F_{x,m,n} x_m - F_{y,m,n} y_n) = 0 \quad (16)$$

Combining (12) to (16), results in:

$$\sum_{m,n} F_{x,m,n} = \sum_{m,n} F_{x,m,n} x_m = \sum_{m,n} F_{x,m,n} y_n = 0 \quad (17a)$$

$$\sum_{m,n} F_{y,m,n} = \sum_{m,n} F_{y,m,n} x_m = \sum_{m,n} F_{y,m,n} y_n = 0 \quad (17b)$$

As described above, the artifact plate has a square N×N mark array of the same size as the stage sample site array. The origin of the plate x-y axis is located at the center of the mark array. The plate axis will move with the plate during its motions. The nominal mark locations in the plate coordinate system are the same as the sample site locations in the stage coordinate system (Equation 2). The plate is not perfect, i.e. each actual mark at (m,n) deviates from its nominal location by $\overline{A}_{m,n}$ ($\overline{A}_{m,n}$~0.1 μm in a plate fabricated on state-of-the-art pattern generators):

$$\overline{A}_{m,n} = A_{x,m,n} \overline{e}_{px} + A_{y,m,n} \overline{e}_{py} \quad (18)$$

where m=−(N−1)/2 ... (N−1)/2, n=−(N−1)/2 ... (N−1)/2. Also, $\overline{e}_{px}$ and $\overline{e}_{py}$ are the unit vectors of the plate axis. It should be noted that every mark on the artifact plate has an identification number (m,n). The mark's identification number does not change during the plate's motions on the stage. (To be able to identify each physical mark on the plate will be important when we later compare different measurement views).

$\overline{A}_{m,n}$ has two properties (by similar reasoning as for the stage distortion):

Property I: $\overline{A}_{m,n}$ has no translation:

$$\sum_{m,n} A_{x,m,n} = 0 \quad (19a)$$

$$\sum_{m,n} A_{y,m,n} = 0 \quad (19b)$$

Property II: $\overline{A}_{m,n}$ has no rotation:

$$\sum_{m,n} (A_{y,m,n} x_m - A_{x,m,n} y_n) = 0 \quad (20)$$

However, $\overline{A}_{m,n}$ may have magnification relative to the stage grid scale.

In View 0, the plate is placed on the stage with the stage and plate axis roughly aligned. The measured deviation for mark (m,n) from its nominal position in the stage coordinate system is denoted as $\overline{V}_{0,m,n}$, where subscript '0' represents View 0. So:

$$\overline{V}_{0,m,n} = V_{0,x,m,n} \overline{e}_x + V_{0,y,m,n} \overline{e}_y \quad (21)$$

The alignment between the stage axis and plate axis cannot be perfect, i.e. there is a small offset between their origins, and a small rotation between their orientations. Therefore:

$$V_{0,x,m,n} = G_{x,m,n} + A_{x,m,n} + E_{0,x,m,n} \quad (22a)$$

$$V_{0,y,m,n} = G_{y,m,n} + A_{y,m,n} + E_{0,y,m,n} \quad (22b)$$

where:

$$E_{0,x,m,n} = -\theta_0 y_n + t_{0x} \quad (23a)$$

$$E_{0,y,m,n} = \theta_0 x_m + t_{0y} \quad (23b)$$

where $\theta_0$ and $\overline{t}_0$ are the rotation and offset of the misalignment. Also, for simplicity, the random measurement noise is ignored. The effect of random noise measurement is discussed below. Substituting (11) and (23) into (22), yields:

$$F_{x,m,n} + A_{x,m,n} = \theta_0 y_n - t_{0x} - Oy_n - Rx_m + V_{0,x,m,n} \quad (24a)$$

$$F_{y,m,n} + A_{y,m,n} = \theta_0 x_m - t_{0y} - Ox_m + Ry_n + V_{0,y,m,n} \quad (24b)$$

Sum over all sites, and using equations (17, 19, 20), yields:

$$t_{0x} = \frac{1}{N^2} \sum_{m,n} V_{0,x,m,n} \quad (25a)$$

$$t_{0y} = \frac{1}{N^2} \sum_{m,n} V_{0,y,m,n} \quad (25b)$$

Doing the rotational combination to (24), and using equations (17, 19, 20), yields:

$$\theta_0 = \frac{\sum_{m,n} (V_{0,y,m,n} x_m - V_{0,x,m,n} y_n)}{\sum_{m,n} (x_m^2 + y_n^2)} \quad (26)$$

After computing the $\theta_0$ and $\bar{t}_0$, let:

$$U_{0,x,m,n} = V_{0,x,m,n} - t_{0x} + \theta_0 y_n \quad (27a)$$

$$U_{0,y,m,n} = V_{0,y,m,n} - t_{0y} - \theta_0 x_m \quad (27b)$$

(Transformation from $\bar{V}_{0,m,n}$ to $\bar{U}_{0,m,n}$ is commonly referred to as multiple-point alignment.) Combining (27) and (24), yields:

$$F_{x,m,n} + A_{x,m,n} = -Oy_n - Rx_m + U_{0,x,m,n} \quad (28a)$$

$$F_{y,m,n} + A_{y,m,n} = -Ox_m + Ry_n + U_{0,y,m,n} \quad (28b)$$

In View 1, the plate is counter-clockwise rotated nominally 90° relative to View 0. So, the axis orientation is that the plate x axis is along the stage y direction, and plate y axis is along the stage -x direction. The measured deviation for mark (m,n) from its nominal position in the stage coordinate system is denoted as $\bar{V}_{1,m,n}$, where subscript '1' represents the View 1. It should be remembered that mark (m,n) here is the same physical mark (m,n) in View 0, even though it is located at a different position relative to the stage:

$$\bar{V}_{1,m,n} = V_{1,x,m,n} \bar{e}_x + V_{1,y,m,n} \bar{e}_y \quad (29)$$

where:

$$V_{1,x,m,n} = G_{x,-n,m} - A_{y,m,n} + E_{1,x,m,n} \quad (30a)$$

$$V_{1,y,m,n} = G_{y,-n,m} + A_{x,m,n} + E_{1,y,m,n} \quad (30b)$$

where $\bar{E}_{1,m,n}$ is the misalignment error, and can be eliminated by the same procedure as in View 0 (multiple-point alignment). Therefore, we obtain:

$$F_{x,-n,m} - A_{y,m,n} = -Ox_m + Ry_n + U_{1,x,m,n} \quad (31a)$$

$$F_{y,-n,m} + A_{x,m,n} = Oy_n + Rx_m + U_{1,y,m,n} \quad (31b)$$

where:

$$U_{1,x,m,n} = V_{1,x,m,n} - \frac{1}{N^2} \sum_{m,n} V_{1,x,m,n} + \quad (31c)$$

$$\frac{\sum_{m,n} (V_{1,y,m,n} x_m - V_{1,x,m,n} y_n)}{\sum_{m,n} (x_m^2 + y_n^2)} y_n$$

$$U_{1,y,m,n} = V_{1,y,m,n} - \frac{1}{N^2} \sum_{m,n} V_{1,y,m,n} - \quad (31d)$$

-continued $$\frac{\sum_{m,n} (V_{1,y,m,n} x_m - V_{1,x,m,n} y_n)}{\sum_{m,n} (x_m^2 + y_n^2)} x_m$$

Computation of the non-four-fold rotationally symmetric distortion components will now be described. From the previous two sub-sections, equations (28) and (31):

$$F_{x,m,n} + A_{x,m,n} = -Oy_n - Rx_m + U_{0,x,m,n} \quad (32a)$$

$$F_{y,m,n} + A_{y,m,n} = -Ox_m + Ry_n + U_{0,y,m,n} \quad (32b)$$

$$F_{x,-n,m} - A_{y,m,n} = -Ox_m + Ry_n + U_{1,x,m,n} \quad (32c)$$

$$F_{y,-n,m} + A_{x,m,n} = Oy_n + Rx_m + U_{1,y,m,n} \quad (32d)$$

(32a)−(32d), yields:

$$F_{x,m,n} - F_{y,-n,m} = -2Oy_n - 2Rx_m + U_{0,x,m,n} - U_{1,y,m,n} \quad (33a)$$

(32b)+(32c), yields:

$$F_{y,m,n} + F_{x,-n,m} = -2Ox_m + 2Ry_n + U_{0,y,m,n} + U_{1,x,m,n} \quad (33b)$$

Multiplying (33a) with $y_n$, and (33b) with $x_m$, sum up then sum over m and n, using equation (17), yields:

$$O = \frac{\sum_{m,n} [(U_{0,x,m,n} - U_{1,y,m,n}) y_n + (U_{0,y,m,n} + U_{1,x,m,n}) x_m]}{2 \sum_{m,n} (x_m^2 + y_n^2)} \quad (34)$$

$$= \frac{1}{2} \left[ \frac{\sum_{m,n} (U_{0,x,m,n} y_n - U_{0,y,m,n} x_m)}{\sum_{m,n} (x_m^2 + y_n^2)} + \frac{\sum_{m,n} (U_{1,x,m,n} x_m - U_{1,y,m,n} y_n)}{\sum_{m,n} (x_m^2 + y_n^2)} \right]$$

i.e. O equals the average of the x-y non-orthogonality in $\bar{U}_{0,m,n}$ and $\bar{U}_{1,m,n}$.

Similarly, multiplying (33a) with $x_m$, and (33b) with $y_n$, sum up and then sum over m and n, using equation (17), yields:

$$R = \frac{\sum_{m,n} [(U_{0,x,m,n} - U_{1,y,m,n}) x_m - (U_{0,y,m,n} + U_{1,x,m,n}) y_n]}{2 \sum_{m,n} (x_m^2 + y_n^2)} \quad (35)$$

$$= \frac{1}{2} \left[ \frac{\sum_{m,n} (U_{0,x,m,n} x_m - U_{0,y,m,n} y_n)}{\sum_{m,n} (x_m^2 + y_n^2)} + \frac{\sum_{m,n} (-U_{1,x,m,n} y_n - U_{1,y,m,n} x_m)}{\sum_{m,n} (x_m^2 + y_n^2)} \right]$$

i.e. R equals the average of the x/y-scale-difference in $\bar{U}_{0,m,n}$ and $\bar{U}_{1,m,n}$.

After obtaining O and R, (33) can be re-written as:

$$F_{x,m,n} - F_{y,-n,m} = P_{m,n} \quad (36a)$$

$$F_{y,m,n} + F_{x,-n,m} = Q_{m,n} \quad (36b)$$

where:

$$P_{m,n} = -2Oy_n - 2Rx_m + U_{0,x,m,n} - U_{1,y,m,n} \quad (37a)$$

$$Q_{m,n} = -2Ox_m + 2Ry_n + U_{0,y,m,n} + U_{1,x,m,n} \tag{37b}$$

At this point, the distortion values are expanded using a Discrete Fourier Transform:

$$F_{x,m,n} = \sum_{k=-\frac{N-1}{2}}^{\frac{N-1}{2}} \sum_{l=-\frac{N-1}{2}}^{\frac{N-1}{2}} a_{k,l} e^{j\frac{2\pi}{L}(kx_m+ly_n)} \tag{38a}$$

$$F_{y,m,n} = \sum_{k=-\frac{N-1}{2}}^{\frac{N-1}{2}} \sum_{l=-\frac{N-1}{2}}^{\frac{N-1}{2}} b_{k,l} e^{j\frac{2\pi}{L}(kx_m+ly_n)} \tag{38b}$$

where N is an odd number, so all k and l are integers. Because $\overline{F}_{m,n}$ are real valued, results in:

$$a_{k,l} = a^*_{-k,-l} \tag{39a}$$

$$b_{k,l} = b^*_{-k,-l} \tag{39b}$$

where * denotes complex conjugate

Substitute equation (2) into (38), yields:

$$F_{x,m,n} = \sum_{k=-\frac{N-1}{2}}^{\frac{N-1}{2}} \sum_{l=-\frac{N-1}{2}}^{\frac{N-1}{2}} a_{k,l} e^{j\frac{2\pi}{N}(km+ln)} \tag{40a}$$

$$F_{x,-n,m} = \sum_{k=-\frac{N-1}{2}}^{\frac{N-1}{2}} \sum_{l=-\frac{N-1}{2}}^{\frac{N-1}{2}} a_{k,l} e^{j\frac{2\pi}{N}(-kn+lm)} \tag{40b}$$

$$F_{y,m,n} = \sum_{k=-\frac{N-1}{2}}^{\frac{N-1}{2}} \sum_{l=-\frac{N-1}{2}}^{\frac{N-1}{2}} b_{k,l} e^{j\frac{2\pi}{N}(km+ln)} \tag{40c}$$

$$F_{y,-n,m} = \sum_{k=-\frac{N-1}{2}}^{\frac{N-1}{2}} \sum_{l=-\frac{N-1}{2}}^{\frac{N-1}{2}} b_{k,l} e^{j\frac{2\pi}{N}(-kn+lm)} \tag{40d}$$

For (40b,d), an index change $k \to -l$, and $l \to k$, results in:

$$F_{x,-n,m} = \sum_{k=-\frac{N-1}{2}}^{\frac{N-1}{2}} \sum_{l=-\frac{N-1}{2}}^{\frac{N-1}{2}} a_{-l,k} e^{j\frac{2\pi}{N}(km+ln)} \tag{40e}$$

$$F_{y,-n,m} = \sum_{k=-\frac{N-1}{2}}^{\frac{N-1}{2}} \sum_{l=-\frac{N-1}{2}}^{\frac{N-1}{2}} b_{-l,k} e^{j\frac{2\pi}{N}(km+ln)} \tag{40f}$$

Substituting (40a,c,e,f) into (36), yields:

$$\sum_{k=-\frac{N-1}{2}}^{\frac{N-1}{2}} \sum_{l=-\frac{N-1}{2}}^{\frac{N-1}{2}} (a_{k,l} - b_{-l,k}) e^{j\frac{2\pi}{N}(km+ln)} = P_{m,n} \tag{41a}$$

$$\sum_{k=-\frac{N-1}{2}}^{\frac{N-1}{2}} \sum_{l=-\frac{N-1}{2}}^{\frac{N-1}{2}} (a_{-l,k} - b_{k,l}) e^{j\frac{2\pi}{N}(km+ln)} = Q_{m,n} \tag{41b}$$

Fourier transform $P_{m,n}$ and $Q_{m,n}$:

$$P_{m,n} = \sum_{k=-\frac{N-1}{2}}^{\frac{N-1}{2}} \sum_{l=-\frac{N-1}{2}}^{\frac{N-1}{2}} p_{k,l} e^{j\frac{2\pi}{N}(km+ln)} \tag{42a}$$

$$Q_{m,n} = \sum_{k=-\frac{N-1}{2}}^{\frac{N-1}{2}} \sum_{l=-\frac{N-1}{2}}^{\frac{N-1}{2}} q_{k,l} e^{j\frac{2\pi}{N}(km+ln)} \tag{42b}$$

where $p_{k,l}$ and $q_{k,l}$ can be computed using a Discrete Fourier Transform (DFT). Combining (41) and (42), yields:

$$a_{k,l} - b_{-l,k} = p_{k,l} \tag{43a}$$

$$a_{-l,k} + b_{k,l} = q_{k,l} \tag{43b}$$

Changing index in (43b), (43) can be converted to:

$$a_{k,l} - b_{-l,k} = p_{k,l} \tag{44a}$$

$$a_{k,l} + b_{l,-k} = q_{l,-k} \tag{44b}$$

Combining (44) and (39), yields:

$$Re(a_{k,l}) - Re(b_{-l,k}) = Re(p_{k,l}) \tag{45a}$$

$$Re(a_{k,l}) + Re(b_{-l,k}) = Re(q_{l,-k}) \tag{45b}$$

and $$Im(a_{k,l}) - Im(b_{-l,k}) = Im(p_{k,l}) \tag{46a}$$

$$Im(a_{k,l}) - Im(b_{-l,k}) = Im(q_{l,-k}) \tag{46b}$$

where 'Re' and 'Im' are the real and imaginary part operators respectively

The real part of $a_{k,l}$ and $b_{k,l}$ can be solved by (45):

$$Re(a_{k,l}) = \frac{1}{2}(Re(p_{k,l}) + Re(q_{l,-k})) \tag{47a}$$

$$Re(b_{-l,k}) = \frac{1}{2}(-Re(p_{k,l}) + Re(q_{l,-k})) \tag{47b}$$

However, the imaginary part cannot be uniquely determined by (46), because the four-fold rotational-symmetric distortion about the pivoting point is not detectable in a 90° rotation. When there is no random measurement noise, $Im(p_{k,l})$ equals $Im(q_{l,-k})$, i.e. equation (46a) and (46b) is the same. This is because a 90° rotation is slightly more than enough to compute the non-4-fold rotational symmetric components of the stage distortion. This redundancy can be used to reduce the effect of the measurement noise, i.e., combining (46a,b):

$$Im(a_{k,l}) - Im(b_{-l,k}) = \frac{1}{2}(Im(p_{k,l}) + Im(q_{l,-k})) \tag{48}$$

If the 4-fold rotational-symmetric distortion is ignored, the least square estimation can be used to solve equation (48), which minimizes the total distortion energy under the restriction of (48):

$$Im(a_{k,l}) = \frac{1}{4}(Im(p_{k,l}) + Im(q_{l,-k})) \tag{49a}$$

$$Im(b_{-l,k}) = -\frac{1}{4}(Im(p_{k,l}) + Im(q_{l,-k})) \tag{49b}$$

The real parts of $a_{k,l}$ and $b_{k,l}$ represent the non-2-fold rotational-symmetric distortion components, while imaginary parts are the 2-fold rotational-symmetric portion. Of the 2-fold rotational-symmetric portion, $\text{Im}(a_{k,l})-\text{Im}(b_{-l,k})$ is the non-4-fold rotational-symmetric distortion components, while $\text{Im}(a_{k,l})+\text{Im}(b_{-l,k})$ is the 4-fold rotational-symmetric components. That is why only $\text{Im}(a_{k,l})+\text{Im}(b_{-l,k})$ cannot be determined by View 0 and View 1.

In View 2, the plate is translated from View 0 by roughly one sample site interval along +x direction relative to the stage, with the stage and plate axis roughly aligned. In this view, the far right column of marks are shifted outside the initial N×N stage sample sites, and hence cannot be used to perform the multiple-point alignment in eliminating the misalignment error. This is due to two reasons: (1) this column of marks may not be measurable, since the initial N×N sample sites may have already occupied the whole measurable field; (2) even if the stage can measure this column, the data cannot be used, since it involves the stage distortion outside the initial N×N sample sites so that the new N×N sites in View 2 do not have the properties of no translation and no rotation. Therefore, only the (N−1) columns in View 2 within the initial N×N sites can be used. However, we still cannot use this (N−1)×N sites to do multiple-point alignment, since the (N−1)×N sites, as a sub-set of the initial N×N, do not have the properties of no translation and no rotation. The solution to this problem is to catch the misalignment error in View 2 by studying its perturbation to the properties of $\overline{F}_{m,n}$, and its perturbation to the already computed non-4-fold rotational symmetric components from View 0 and View 1.

In View 2, the measured deviation of mark (m,n) from its nominal position in the stage coordinate system is denoted as $\overline{V}_{2,m,n}$, where subscript '2' represents View 2. The subscript 'm' is from '−(N−1)/2' to '(N−1)/2−1', because the far-right column, i.e. m=(N−1)/2, is not used. Mark (m,n) here is the same physical mark (m,n) in View 0, even though it is located at a different position relative to the stage (by about one sample site interval translation). So:

$$\overline{V}_{2,m,n} = V_{2,x,m,n}\overline{e}_x + V_{2,y,m,n}\overline{e}_y \tag{50}$$

where:

$$V_{2,x,m,n} = G_{x,m+1,n} + A_{x,m,n} + E_{2,x,m,n} \tag{51a}$$

$$V_{2,y,m,n} = G_{y,m+1,n} + A_{y,m,n} + E_{2,y,m,n} \tag{51b}$$

where m=−(N−1)/2 ... (N−1)/2−1, n=−(N−1)/2 ... (N−1)/2, and:

$$E_{2,x,m,n} = -\theta_2 y_n + t_{2x} \tag{52a}$$

$$E_{2,y,m,n} = \theta_2 x_m + t_{2y} \tag{52b}$$

where $\theta_2$ and $\bar{t}_2$ are the rotation and offset in the misalignment. To keep the notation consistent with the previous two views, $\overline{U}_{2,m,n}$ is used instead of $\overline{V}_{2,m,n}$.

$$U_{2,x,m,n} = V_{2,x,m,n} \tag{53a}$$

$$U_{2,y,m,n} = V_{2,y,m,n} \tag{53b}$$

Substituting (52), (53), and (11) into (51), noting that '$x_{m+1} = x_m + \Delta$', yields:

$$F_{x,m+1,n} + A_{x,m,n} = -Oy_n - Rx_m + U_{2,x,m,n} + \xi_x - \xi_\theta y_n \tag{54a}$$

$$F_{y,m+1,n} + A_{y,m,n} = -Ox_m + Ry_n + U_{2,y,m,n} + \xi_y + \xi_\theta x_m \tag{54b}$$

where: m=−(N−1)/2 ... (N−1)/2−1, n=−(N−1)/2 ... (N−1)/2

$$\xi_x = -(t_{2x} + R\Delta)$$

$$\xi_y = -(t_{2y} + O\Delta)$$

$$\xi_\theta = -\theta_2$$

Subtracting (28) from (54), results in:

$$F_{x,m+1,n} - F_{x,m,n} = U_{2,x,m,n} - U_{0,x,m,n} + \xi_x - \xi_\theta y_n \tag{55a}$$

$$F_{y,m+1,n} - F_{y,m,n} = U_{2,y,m,n} - U_{0,y,m,n} + \xi_y + \xi_\theta x_m \tag{55b}$$

The experimental measurement '$U_{2,m,n} - U_{0,m,n}$' and the three $\xi$'s should keep the $\overline{F}_{m,n}$ satisfy its properties in Equation (17), from which some relationship can be found between the three $\xi$'s. Summing over n=−(N−1)/2 ... (N−1)/2 in (55) yields:

$$H_{x,m+1} - H_{x,m} = Z_{x,m} + x \tag{56a}$$

$$H_{y,m+1} - H_{y,m} = Z_{y,m} + N\xi_y + N\xi_\theta x_m \tag{56b}$$

where: m=−(N−1)/2 ... (N−1)/2−1

$$H_{x,m} = \sum_n F_{x,m,n}$$

$$H_{y,m} = \sum_n F_{y,m,n}$$

$$Z_{x,m} = \sum_n (U_{2,x,m,n} - U_{0,x,m,n})$$

$$Z_{y,m} = \sum_n (U_{2,y,m,n} - U_{0,y,m,n})$$

Consider $H_x$:

$$\sum_{m=-(N-1)/2}^{(N-1)/2} H_{x,m}x_m = H_{x,-(N-1)/2}x_{-(N-1)/2} + \tag{57}$$

$$[(H_{x,-(N-1)/2+1} - H_{x,-(N-1)/2}) + H_{x,-(N-1)/2}]x_{-(N-1)/2+1} + \cdots +$$

$$[(H_{x,(N-1)/2} - H_{x,(N-1)/2-1}) + (H_{x,(N-1)/2-1} - H_{x,(N-1)/2-2}) + \cdots +$$

$$H_{x,-(N-1)/2}]x_{(N-1)/2} = H_{x,-(N-1)/2} \sum_{m=-(N-1)/2}^{(N-1)/2} x_m +$$

$$(H_{x,-(N-1)/2+1} - H_{x,-(N-1)/2}) \sum_{m=-(N-1)/2+1}^{(N-1)/2} x_m + \cdots +$$

$$(H_{x,(N-1)/2} - H_{x,(N-1)/2-1}) \sum_{m=-(N-1)/2}^{(N-1)/2} x_m$$

Substitute (56a) into (57), and noting that $$\sum_{m=-(N-1)/2}^{(N-1)/2} x_m = 0,$$

we get:

$$\sum_{m=-(N-1)/2}^{(N-1)/2} H_{x,m}x_m = \tag{58}$$

-continued $$N\xi_x \left( \sum_{m=-(N-1)/2+1}^{(N-1)/2} x_m + \sum_{m=-(N-1)/2+2}^{(N-1)/2} x_m + \ldots + \sum_{m=(N-1)/2}^{(N-1)/2} x_m \right) + \left( Z_{x,-(N-1)/2} \sum_{m=-(N-1)/2+1}^{(N-1)/2} x_m + Z_{x,-(N-1)/2+1} \sum_{m=-(N-1)/2+2}^{(N-1)/2} x_m + \ldots + Z_{x,(N-1)/2-1} \sum_{m=(N-1)/2}^{(N-1)/2} x_m \right)$$

But by (17):

$$\sum_{m=-(N-1)/2}^{(N-1)/2} H_{x,m} x_m = \sum_{m,n} F_{x,m,n} x_m = 0$$

Therefore (58) yields:

$$\xi_x = -\frac{\left( Z_{x,-(N-1)/2} \sum_{m=-(N-1)/2+1}^{(N-1)/2} x_m + Z_{x,-(N-1)/2+1} \sum_{m=-(N-1)/2+2}^{(N-1)/2} x_m + \ldots + Z_{x,(N-1)/2-1} \sum_{m=(N-1)/2}^{(N-1)/2} x_m \right)}{N \left( \sum_{m=-(N-1)/2+1}^{(N-1)/2} x_m + \sum_{m=-(N-1)/2+2}^{(N-1)/2} x_m + \ldots + \sum_{m=(N-1)/2}^{(N-1)/2} x_m \right)} \quad (59)$$

Now consider $H_y$:

$$\sum_{m=-(N-1)/2}^{(N-1)/2} H_{y,m} x_m = H_{y,-(N-1)/2} x_{-(N-1)/2} + \quad (60)$$

$$[(H_{y,-(N-1)/2+1} - H_{y,-(N-1)/2}) + H_{y,-(N-1)/2}] x_{-(N-1)/2+1} + \ldots +$$

$$[(H_{y,(N-1)/2} - H_{y,(N-1)/2-1}) + (H_{y,(N-1)/2-1} - H_{y,(N-1)/2-2}) + \ldots +$$

$$H_{y,-(N-1)/2}] x_{(N-1)/2} = H_{y,-(N-1)/2} \sum_{m=-(N-1)/2}^{(N-1)/2} x_m +$$

$$(H_{y,-(N-1)/2+1} - H_{y,-(N-1)/2}) \sum_{m=-(N-1)/2+1}^{(N-1)/2} x_m + \ldots +$$

$$(H_{y,(N-1)/2} - H_{y,(N-1)/2-1}) \sum_{m=(N-1)/2}^{(N-1)/2} x_m$$

Substitute (56b) into (60), and noting that $$\sum_{m=-(N-1)/2}^{(N-1)/2} x_m = 0,$$

results in:

$$\sum_{m=-(N-1)/2}^{(N-1)/2} H_{y,m} x_m = \quad (61)$$

$$N\xi_y \left( \sum_{m=-(N-1)/2+1}^{(N-1)/2} x_m + \sum_{m=-(N-1)/2+2}^{(N-1)/2} x_m + \ldots + \sum_{m=(N-1)/2}^{(N-1)/2} x_m \right) +$$

$$N\xi_\theta \left( x_{-(N-1)/2} \sum_{m=-(N-1)/2+1}^{(N-1)/2} x_m + x_{-(N-1)/2+1} \sum_{m=-(N-1)/2+2}^{(N-1)/2} x_m + \right.$$

$$\left. \ldots + x_{(N-1)/2-1} \sum_{m=(N-1)/2}^{(N-1)/2} x_m \right) + \left( Z_{y,-(N-1)/2} \sum_{m=-(N-1)/2+1}^{(N-1)/2} x_m + \right.$$

$$\left. Z_{y,-(N-1)/2+1} \sum_{m=-(N-1)/2+2}^{(N-1)/2} x_m + \ldots + Z_{y,(N-1)/2-1} \sum_{m=(N-1)/2}^{(N-1)/2} x_m \right)$$

But by (17):

$$\sum_{m=-(N-1)/2}^{(N-1)/2} H_{y,m} x_m = \sum_{m,n} F_{y,m,n} x_m = 0$$

So (61) yields:

$$N\xi_y \left( \sum_{m=-(N-1)/2+1}^{(N-1)/2} x_m + \sum_{m=-(N-1)/2+2}^{(N-1)/2} x_m + \ldots + \sum_{m=(N-1)/2}^{(N-1)/2} x_m \right) + N\xi_\theta \left( x_{-(N-1)/2} \sum_{m=-(N-1)/2+1}^{(N-1)/2} x_m + \right. \quad (62)$$

$$\left. x_{-(N-1)/2+1} \sum_{m=-(N-1)/2+2}^{(N-1)/2} x_m + \ldots + x_{(N-1)/2-1} \sum_{m=(N-1)/2}^{(N-1)/2} x_m \right) +$$

$$\left( Z_{y,-(N-1)/2} \sum_{m=-(N-1)/2+1}^{(N-1)/2} x_m + Z_{y,-(N-1)/2+1} \sum_{m=-(N-1)/2+2}^{(N-1)/2} x_m + \right.$$

-continued $$\left. \ldots + Z_{y,(N-1)/2-1} \sum_{m=(N-1)/2}^{(N-1)/2} x_m \right) = 0$$

which is a linear relationship between $\xi_y$ and $\xi_\theta$.

The effect of $\xi_x$ is on the x-direction magnification of the distortion function, and the effect $\xi_y$ is on the x-axis rotation. Because, by definition $\overline{F}_{m,n}$ has no magnification nor rotation in both x and y, (59) and (62) result. However, $\xi_y$ is confounded with $\xi_\theta$. To further catch $\xi_\theta$, we need to study its perturbation to the already computed non-4-fold rotational-symmetric distortion components, i.e. the real part of the Fourier expansion coefficients.

Equation (55) is only valid for $m=-(N-1)/2 \ldots (N-1)/2-1$, which is incomplete for solving the Fourier transform. Therefore, there is a need to add one column of data to represent the far-right column of marks in View 2. The boundary condition in this problem is that $\overline{F}_{m,n}$ is a periodic function with period of N in both x and y, since all Fourier bases in (38) are periodic with period N. (This assumption is not true for the actual stage distortion, but it is of no concern since we do not care about the distortion outside the initial N×N sites). If a column is added, i.e. the column with $m=(N+1)/2$, into equation (55) that preserves the periodic condition of $\overline{F}_{m,n}$, it will preserve the correct Fourier transform coefficients inside the initial N×N array. The added distortion is denoted using the same symbol $\overline{F}_{m,n}$, where $m=(N+1)/2$, $n=-(N-1)/2 \ldots N-1)/2$.

$$\overline{F}_{(N+1)/2,n} = \overline{F}_{-(N-1)/2,n} \quad (63)$$

So:

$$F_{x,(N+1)/2,n} = F_{x,-(N-1)/2,n} - F_{x,(N-1)/2,n} \quad (64)$$

$$F_{x,(N-1)/2,n} = -(F_{x,(N-1)/2,n} - F_{x,-(N-1)/2,n})$$

$$= -\begin{bmatrix} (F_{x,(N-1)/2,n} - F_{x,(N-1)/2-1,n}) + \\ (F_{x,(N-1)/2-1,n} - F_{x,(N-1)/2-2,n}) + \ldots + \\ (F_{x,-(N-1)/2+1,n} - F_{x,-(N-1)/2,n}) \end{bmatrix}$$

Substitute (55a) into (64), results in:

$$F_{x,(N+1)/2,n} - F_{x,(N-1)/2,n} = \quad (65a)$$

$$-\sum_{m=-(N-1)/2}^{(N-1)/2-1} (U_{2,x,m,n} - U_{0,x,m,n}) - (N-1)\xi_x + (N-1)\xi_\theta y_n$$

similarly, results in:

$$F_{y,(N+1)/2,n} - F_{y,(N-1)/2,n} = \quad (65b)$$

$$-\sum_{m=-(N-1)/2}^{(N-1)/2-1} (U_{2,y,m,n} - U_{0,y,m,n}) - (N-1)\xi_y + \xi_\theta x_{(N-1)/2}$$

Let:

$$W_{m,n} = \begin{cases} U_{2,x,m,n} - U_{0,x,m,n} & \text{For } m = -(N-1)/2 \ldots (N-1)/2 - 1 \\ -\sum_{m'=-(N-1)/2}^{(N-1)/2-1} (U_{2,x,m',n} - U_{0,x,m',n}) & \text{For } m = (N-1)/2 \end{cases} \quad (66a)$$

$$T_{m,n} = \begin{cases} U_{2,y,m,n} - U_{0,y,m,n} & \text{For } m = -(N-1)/2 \ldots (N-1)/2 - 1 \\ -\sum_{m'=-(N-1)/2}^{(N-1)/2-1} (U_{2,y,m',n} - U_{0,y,m',n}) & \text{For } m = (N-1)/2 \end{cases} \quad (66b)$$

$$\eta_{m,n} = \begin{cases} 1 & \text{For } m = -(N-1)/2 \ldots (N-1)/2 - 1 \\ -(N-1) & \text{For } m = (N-1)/2 \end{cases} \quad (66c)$$

$$\sigma_{m,n} = -\eta_{m,n} y_n \quad (66d)$$

$$\tau_{m,n} = x_m \quad (66e)$$

Combining (55), (65), and (66), yields:

$$F_{x,m+1,n} - F_{x,m,n} = W_{m,n} + \xi_x \eta_{m,n} + \xi_\theta \sigma_{m,n} \quad (67a)$$

$$F_{y,m+1,n} - F_{y,m,n} = T_{m,n} + \xi_y \eta_{m,n} + \xi_\theta \tau_{m,n} \quad (67b)$$

where m=−(N−1)/2 ... (N−1)/2, n=−(N−1)/2 ... (N−1)/2
Fourier transform the $W_{m,n}$, $T_{m,n}$, $\eta_{m,n}$, $\sigma_{m,n}$, and $\tau_{m,n}$:

$$W_{m,n} = \sum_{k=-\frac{N-1}{2}}^{\frac{N-1}{2}} \sum_{l=-\frac{N-1}{2}}^{\frac{N-1}{2}} w_{k,l} e^{j\frac{2\pi}{N}(km+ln)} \quad (68a)$$

$$T_{m,n} = \sum_{k=-\frac{N-1}{2}}^{\frac{N-1}{2}} \sum_{l=-\frac{N-1}{2}}^{\frac{N-1}{2}} t_{k,l} e^{j\frac{2\pi}{N}(km+ln)} \quad (68b)$$

$$\eta_{m,n} = \sum_{k=-\frac{N-1}{2}}^{\frac{N-1}{2}} \sum_{l=-\frac{N-1}{2}}^{\frac{N-1}{2}} \tilde{\eta}_{k,l} e^{j\frac{2\pi}{N}(km+ln)} \quad (68c)$$

$$\sigma_{m,n} = \sum_{k=-\frac{N-1}{2}}^{\frac{N-1}{2}} \sum_{l=-\frac{N-1}{2}}^{\frac{N-1}{2}} \tilde{\sigma}_{k,l} e^{j\frac{2\pi}{N}(km+ln)} \quad (68d)$$

$$\tau_{m,n} = \sum_{k=-\frac{N-1}{2}}^{\frac{N-1}{2}} \sum_{l=-\frac{N-1}{2}}^{\frac{N-1}{2}} \tilde{\tau}_{k,l} e^{j\frac{2\pi}{N}(km+ln)} \quad (68e)$$

Substituting (40) and (68) into (67), results in:

$$a_{k,l} = \gamma_{k,l}(w_{k,l} + \xi_x \tilde{\eta}_{k,l} + \xi_\theta \tilde{\sigma}_{k,l}) \quad (69a)$$

$$b_{k,l} = \gamma_{k,l}(t_{k,l} + \xi_y \tilde{\eta}_{k,l} + \xi_\theta \tilde{\tau}_{k,l}) \quad (69b)$$

where $$\gamma_{k,l} = \frac{1}{e^{j\frac{2\pi}{N}k} - 1} \quad (69c)$$

For a general N, the shape of the four matrices $\eta_{k,l}$, $\sigma_{k,l}$, $\tau_{k,l}$, $\gamma_{k,l}$ are shown in FIGS. 11a to 11d. Further, the real part of '$\gamma_{k,l}\eta_{k,l}$' are all zeros. Therefore, $\xi_x$ and $\xi_y$ do not contribute to the real part of $a_{k,l}$ and $b_{k,l}$ (this is because the effect of $\xi_x$ and $\xi_y$ is only to add respectively a net x-magnification and a net x-axis rotation to $F_{m,n}$, both of which are 2-fold rotational-symmetric, and thus do not contribute to the real part of $a_{k,l}$ and $b_{k,l}$). So, we can use the real part of equation (69), together with the real part of $a_{k,l}$ and $b_{k,l}$ already computed earlier to compute $\xi_\theta$. Because of the shape of matrices $\sigma_{k,l}$, $\tau_{k,l}$, (69a) gives solution to $\xi_\theta$ at 'k≠0 and l≠0', and (69b) gives solution to $\xi_\theta$ at 'k≠0 and l=0'. When there is no random measurement noise, all these solutions of $\xi_\theta$ are exactly the same. In practice, we can minimize the noise by using the average of all these $\xi_\theta$'s. (An even better method for noise-minimization is to use a weighted average, with the weight inversely proportional to the variance of the individual $\xi_\theta$). After obtaining the $\xi_\theta$, we can then use equation (62) to compute $\xi_y$.

After solving all three $\xi$'s, (69) can then be used to solve for all the imaginary part of $a_{k,l}$ and $b_{k,l}$, except for k=0, since $\gamma_{k,l}$ is not defined for k=0. However, those can be obtained using equation (48) combined with the $a_{k,l}$ and $b_{k,l}$ at l=0. As a final note, imaginary part of $c_{0,0}$ and $d_{0,0}$ are not computable, but should be set to zero to satisfy the requirement on real valued distortion, i.e., equation (39).

When there is no random measurement noise, the imaginary parts of $a_{k,l}$ and $b_{k,l}$ solved here also satisfy (48). In practice, to minimize the noise, we should only use the imaginary part of $a_{k,l}$ and $b_{k,l}$ calculated here for '|k|≥|l|', then combine with (48), to obtain the final values of all the imaginary parts of the coefficients. This is because the values obtained here (View 2) have more noise than those obtained from View 0 and View 1, both due to the noise in the three $\xi$'s, and the noise amplification by the phase factor $\gamma_{k,l}$ in (69). The phase factor $\gamma_{k,l}$ is larger for small 'lkl', so we should avoid using small 'lkl' as much as possible. By doing so, we only used View 2 to compute the 4-fold rotational symmetric components, and leave the non-4-fold components computed from View 0 and View 1 unchanged.

After obtaining all $a_{k,l}$ and $b_{k,l}$, we can use equation (38) to reconstruct the distortions on the N×N sample sites. When there is no random measurement noise, the reconstruction is exact.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of calibrating a two-dimensional metrology stage by mapping each of a two-dimensional array of stage positions to a corresponding position in a Cartesian coordinate grid to determine distortion therebetween, comprising the steps of:

providing on the stage a rigid artifact plate having a two-dimensional array of marks thereon at spaced intervals which form an (x,y) grid;

measuring the location of each of the marks on the artifact plate while the artifact plate is maintained in an origin reference location on the stage;

rotating the artifact plate relative to the origin reference location to dispose the artifact plate in a rotated reference location;

measuring the location of each of the marks on the artifact plate while the artifact plate is maintained in the rotated reference location;

determining complete non-four-fold rotationally symmetric distortion between the two-dimensional array of stage positions and the Cartesian coordinate grid, from the measured locations of the marks in the origin and rotated reference locations;

translating the artifact plate at least one interval relative to the origin reference location to dispose the artifact plate in a translated reference location;

measuring the location of each of a plurality of the marks on the artifact plate while the artifact plate is maintained in the translated reference location;

determining incomplete non-four-fold rotationally symmetric distortion between the two-dimensional array of stage positions and the Cartesian coordinate grid, from the measured locations of the marks in the origin and translated reference locations;

determining a two-dimensional translation misalignment error and a rotation misalignment error from the complete non-four-fold rotationally symmetric distortion and the incomplete non-four-fold rotationally symmetric distortion; and determining complete four-fold rotationally symmetric distortion between the two-dimensional array of stage positions and the Cartesian coordinate grid from the translation and rotation misalignment errors and the measured locations of the marks in the origin, rotated and translated reference locations.

2. The method of claim 1, wherein said step of determining a translation misalignment error and a rotation misalignment error comprises determining a two-dimensional translation misalignment error and a rotation misalignment error based on differences between the complete non-four-fold rotationally symmetric distortion and the incomplete non-four-fold rotationally symmetric distortion.

3. The method of claim 1, wherein said step of measuring the location of each of the marks on the artifact plate while the artifact plate is maintained in an origin reference location on the stage comprises measuring the location of each of the marks on the artifact plate by disposing the stage in the two-dimensional array of stage positions.

4. The method of claim 1, wherein said rotating step comprises rotating the artifact plate 90°; and wherein said translating step comprises translating the artifact plate only one interval relative to the origin reference location.

5. The method of claim 1, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction.

6. The method of claim 1, wherein said rotating step comprises rotating the artifact plate 90°; and wherein said translating step comprises translating the artifact plate two intervals in a first direction relative to the origin reference location.

7. The method of claim 1, further comprising the step of determining stage distortion mapping functions $G_x(x,y)$ and $G_y(x,y)$ from the complete non-four-fold rotationally symmetric distortion and the complete four-fold rotationally symmetric distortion.

8. The method of claim 7, wherein said step of providing a rigid artifact plate on the stage comprises providing on the stage a rigid artifact plate having a two-dimensional array of marks thereon at spaced intervals which form an (x,y) grid, so that each of the marks in the two-dimensional array corresponds to a respective point in the Cartesian coordinate grid to which a stage position is mapped.

9. The method of claim 4, wherein the two-dimensional array of marks comprises an N×N two-dimensional array of marks; and wherein said step of measuring the location of a plurality of marks on the artifact plate while the artifact plate is maintained in the translated reference location comprises measuring the location of an N×N−1 array of marks on the artifact plate while the artifact plate is maintained in the translated reference location.

10. The method of claim 5, wherein the two-dimensional array of marks comprises an N×N two-dimensional array of marks; and wherein said step of measuring the location of a plurality of marks on the artifact plate while the artifact plate is maintained in the translated reference location comprises measuring the location of an N−1×N−1 array of marks on the artifact plate while the artifact plate is maintained in the translated reference location.

11. A method of calibrating a two-dimensional metrology stage by mapping each of a two-dimensional array of stage positions to a corresponding position in a Cartesian coordinate grid to determine distortion therebetween, comprising the steps of:

providing on the stage a rigid artifact plate having a two-dimensional array of marks thereon at spaced intervals which form an (x,y) grid, so that each of the marks in the two-dimensional array corresponds to a respective point in the Cartesian coordinate grid to which a stage position is mapped;

measuring the location of each of the marks on the artifact plate while the artifact plate is maintained in an origin reference location on the stage;

rotating the artifact plate relative to the origin reference location to dispose the artifact plate in a rotated reference location;

measuring the location of each of the marks on the artifact plate while the artifact plate is maintained in the rotated reference location;

translating the artifact plate at least one interval relative to the origin reference location to dispose the artifact plate in a translated reference location;

measuring the location of each of the marks on the artifact plate while the artifact plate is maintained in the translated reference location;

determining a translation misalignment error associated with the translated artifact plate, from the measured locations of the marks in the origin and translated reference locations;

determining a rotation misalignment error associated with the translated artifact plate, from the measured locations of the marks in the origin and translated reference locations;

determining a difference between each of the two-dimensional array of stage positions and the corresponding position in the Cartesian coordinate grid, from the translation and rotation misalignment errors and the measured locations of the marks in the origin, rotated and translated reference locations; and wherein said steps of determining the translation and rotation misalignment errors and said step of determining a difference are coupled from each other.

12. The method of claim 11, wherein said step of determining a translation misalignment error is preceded by the step of determining complete non-four-fold rotationally symmetric distortion between the two-dimensional array of stage positions and the Cartesian coordinate grid, from the measured locations of the marks in the origin and rotated reference locations.

13. The method of claim 12, wherein said step of determining a translation misalignment error is preceded by the step of determining incomplete non-four-fold rotationally symmetric distortion between the two-dimensional array of stage positions and the Cartesian coordinate grid, from the measured locations of the marks in the origin and translated reference locations.

14. The method of claim 13, wherein said steps of determining translation and rotation misalignment errors comprise determining translation and rotation misalignment errors based on differences between the complete non-four-fold rotationally symmetric distortion and the incomplete non-four-fold rotationally symmetric distortion.

15. The method of claim 14, wherein said steps of determining translation and rotation misalignment errors are followed by the step of determining complete four-fold rotationally symmetric distortion between the two-dimensional array of stage positions and the Cartesian coordinate grid from the translation and rotation misalignment errors and the measured locations of the marks in the origin, rotated and translated reference locations.

16. The method of claim 11, wherein said rotating step comprises rotating the artifact plate 90°; and wherein said translating step comprises translating the artifact plate only one interval relative to the origin reference location.

17. The method of claim 15, wherein said rotating step comprises rotating the artifact plate 90°; and wherein said translating step comprises translating the artifact plate only one interval relative to the origin reference location.

18. The method of claim 15, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction.

19. The method of claim 15, wherein said rotating step comprises rotating the artifact plate 90°; and wherein said translating step comprises translating the artifact plate two intervals in a first direction relative to the origin reference location.

20. The method of claim 17, wherein the two-dimensional array of marks comprises an N×N two-dimensional array of marks; and wherein said step of measuring the location of a plurality of marks on the artifact plate while the artifact plate is maintained in the translated reference location comprises measuring the location of an N×N−1 array of marks on the artifact plate while the artifact plate is maintained in the translated reference location.

21. The method of claim 17, wherein said rotating step comprises rotating the artifact plate 90°; and wherein said translating step comprises translating the artifact plate only one interval relative to the origin reference location.

22. The method of claim 11, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction; and wherein said step of measuring the location of a plurality of marks on the artifact plate while the artifact plate is maintained in the translated reference location comprises measuring the location of an N−1×N−1 array of marks on the artifact plate while the artifact plate is maintained in the translated reference location.

23. The method of claim 11, wherein said rotating step comprises rotating the artifact plate 90°; and wherein said translating step comprises translating the artifact plate two intervals in a first direction relative to the origin reference location.

24. A computer program product readable by a machine and tangibly embodying a program of instructions executable by the machine to perform method steps for calibrating a two-dimensional metrology stage containing on a surface thereof a rigid artifact plate having a two-dimensional array of marks thereon at spaced intervals which form an (x,y) grid, by mapping each of a two-dimensional array of stage positions which correspond to a respective mark to a corresponding position in a Cartesian coordinate grid to thereby determine distortion therebetween, said method steps comprising:

measuring the location of each of the marks on the artifact plate while the artifact plate is maintained in an origin reference location on the stage;

rotating the artifact plate relative to the origin reference location to dispose the artifact plate in a rotated reference location;

measuring the location of each of the marks on the artifact plate while the artifact plate is maintained in the rotated reference location;

translating the artifact plate at least one interval relative to the origin reference location to dispose the artifact plate in a translated reference location;

measuring the location of each of the marks on the artifact plate while the artifact plate is maintained in the translated reference location;

determining a translation misalignment error associated with the translated artifact plate, from the measured locations of the marks in the origin and translated reference locations;

determining a rotation misalignment error associated with the translated artifact plate, from the measured locations of the marks in the origin and translated reference locations;

determining a difference between each of the two-dimensional array of stage positions and the corresponding position in the Cartesian coordinate grid, from the translation and rotation misalignment errors and the measured locations of the marks in the origin, rotated and translated reference locations; and wherein said steps of determining the translation misalignment error and rotation misalignment error and said step of determining a difference are decoupled from each other.

25. The computer program product of claim 24, wherein said step of determining a translation misalignment error is preceded by the step of determining complete non-four-fold rotationally symmetric distortion between the two-dimensional array of stage positions and the Cartesian coordinate grid, from the measured locations of the marks in the origin and rotated reference locations.

26. The computer program product of claim 25, wherein said step of determining a translation misalignment error is preceded by the step of determining incomplete non-four-fold rotationally symmetric distortion between the two-dimensional array of stage positions and the Cartesian coordinate grid, from the measured locations of the marks in the origin and translated reference locations.

27. The computer program product of claim 26, wherein said steps of determining translation and rotation misalignment errors comprise determining translation and rotation misalignment errors based on differences between the complete non-four-fold rotationally symmetric distortion and the incomplete non-four-fold rotationally symmetric distortion.

28. The computer program product of claim 27, wherein said steps of determining translation and rotation misalignment errors are followed by the step of determining complete four-fold rotationally symmetric distortion between the two-dimensional array of stage positions and the Cartesian coordinate grid from the measured locations of the marks in the origin, rotated and translated reference locations.

29. The computer program product of claim 24, wherein said rotating step comprises rotating the artifact plate 90°; and wherein said translating step comprises translating the artifact plate only one interval relative to the origin reference location.

30. The computer program product of claim 28, wherein said rotating step comprises rotating the artifact plate 90°; and wherein said translating step comprises translating the artifact plate only one interval relative to the origin reference location.

31. The computer program product of claim 28, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction.

32. The computer program product of claim 28, wherein said rotating step comprises rotating the artifact plate 90°; and wherein said translating step comprises translating the artifact plate two intervals in a first direction relative to the origin reference location.

33. The computer program product of claim 30, wherein the two-dimensional array of marks comprises an N×N two-dimensional array of marks; and wherein said step of measuring the location of a plurality of marks on the artifact plate while the artifact plate is maintained in the translated reference location comprises measuring the location of an N×N−1 array of marks on the artifact plate while the artifact plate is maintained in the translated reference location.

34. The computer program product of claim 31, wherein the two-dimensional array of marks comprises an N×N two-dimensional array of marks; and wherein said step of measuring the location of a plurality of marks on the artifact plate while the artifact plate is maintained in the translated reference location comprises measuring the location of an N−1×N−1 array of marks on the artifact plate while the artifact plate is maintained in the translated reference location.

35. The computer program product of claim 24, wherein said rotating step comprises rotating the artifact plate 90°; and wherein said translating step comprises translating the artifact plate only one interval relative to the origin reference location.

36. The computer program product of claim 24, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction.

37. The computer program product of claim 24, wherein said rotating step comprises rotating the artifact plate 90°; and wherein said translating step comprises translating the artifact plate two intervals in a first direction relative to the origin reference location.

38. A computer program product readable by a machine and tangibly embodying a program of instructions executable by the machine to perform method steps for calibrating a two-dimensional metrology stage containing on a surface thereof a rigid artifact plate having a two-dimensional array of marks thereon at spaced intervals which form an (x,y) grid, by mapping each of a two-dimensional array of stage positions which correspond to a respective mark to a corresponding position in a Cartesian coordinate grid to thereby determine distortion therebetween, said method steps comprising:

measuring the location of each of the marks on the artifact plate while the artifact plate is maintained in an origin reference location on the stage;

rotating the artifact plate relative to the origin reference location to dispose the artifact plate in a rotated reference location;

measuring the location of each of the marks on the artifact plate while the artifact plate is maintained in the rotated reference location;

determining complete non-four-fold rotationally symmetric distortion between the two-dimensional array of stage positions and the Cartesian coordinate grid, from the measured locations of the marks in the origin and rotated reference locations;

translating the artifact plate at least one interval relative to the origin reference location to dispose the artifact plate in a translated reference location;

measuring the location of each of a plurality of the marks on the artifact plate while the artifact plate is maintained in the translated reference location;

determining incomplete non-four-fold rotationally symmetric distortion between the two-dimensional array of stage positions and the Cartesian coordinate grid, from the measured locations of the marks in the origin and translated reference locations;

determining a two-dimensional translation misalignment error and a rotation misalignment error from the complete non-four-fold rotationally symmetric distortion and the incomplete non-four-fold rotationally symmetric distortion; and determining complete four-fold rotationally symmetric distortion between the two-dimensional array of stage positions and the Cartesian coordinate grid from the translation and rotation misalignment errors and the measured locations of the marks in the origin, rotated and translated reference locations.

39. The computer program product of claim 38, wherein said step of determining a translation misalignment error and a rotation misalignment error comprises determining a two-dimensional translation misalignment error and a rotation misalignment error based on differences between the complete non-four-fold rotationally symmetric distortion and the incomplete non-four-fold rotationally symmetric distortion.

40. The computer program product of claim 38, wherein said step of measuring the location of each of the marks on the artifact plate while the artifact plate is maintained in an origin reference location on the stage comprises measuring the location of each of the marks on the artifact plate by disposing the stage in the two-dimensional array of stage positions.

41. The computer program product of claim 40, wherein said rotating step comprises rotating the artifact plate 90°; and wherein said translating step comprises translating the artifact plate only one interval relative to the origin reference location.

42. The computer program product of claim 40, wherein said rotating step comprises rotating the artifact plate 90°; and wherein said translating step comprises translating the artifact plate one interval in a first direction relative to the origin reference location and one interval in a second direction relative to the origin reference location which is orthogonal to the first direction.

43. The computer program product of claim 40, wherein said rotating step comprises rotating the artifact plate 90°; and wherein said translating step comprises translating the artifact plate two intervals in a first direction relative to the origin reference location.

44. The computer program product of claim 41, wherein the two-dimensional array of marks comprises an N×N two-dimensional array of marks; and wherein said step of measuring the location of a plurality of marks on the artifact plate while the artifact plate is maintained in the translated reference location comprises measuring the location of an N×N–1 array of marks on the artifact plate while the artifact plate is maintained in the translated reference location.

45. The computer program product of claim 42, wherein the two-dimensional array of marks comprises an N×N two-dimensional array of marks; and wherein said step of measuring the location of a plurality of marks on the artifact plate while the artifact plate is maintained in the translated reference location comprises measuring the location of an N–1×N–1 array of marks on the artifact plate while the artifact plate is maintained in the translated reference location.

46. An apparatus for calibrating a two-dimensional metrology stage by mapping each of a two-dimensional array of stage positions to a corresponding position in a Cartesian coordinate grid to determine distortion therebetween, comprising:

a movable stage for receiving a rigid artifact plate having a two-dimensional array of marks thereon at spaced intervals which form an (x,y) grid on a surface thereof;

means, coupled to said movable stage, for positioning the stage in the two-dimensional array of stage positions while the artifact plate is maintained on the surface in an origin reference location, a rotated reference location and a translated reference location;

means, responsive to said positioning means, for measuring the location of each of the marks on the artifact plate while the artifact plate is maintained in the origin reference location, the rotated reference location and the translated reference location;

means, coupled to said measuring means, for determining complete non-four-fold rotationally symmetric distortion between the two-dimensional array of stage positions and the Cartesian coordinate grid, from the measured locations of the marks in the origin and rotated reference locations;

means, coupled to said measuring means, for determining incomplete non-four-fold rotationally symmetric distortion between the two-dimensional array of stage positions and the Cartesian coordinate grid, from the measured locations of the marks in the origin and translated reference locations;

means, responsive to said means for determining complete and incomplete non-four-fold rotationally symmetric distortion, for determining a two-dimensional translation misalignment error and a rotation misalignment error from the complete non-four-fold rotationally symmetric distortion and the incomplete non-four-fold rotationally symmetric distortion; and means, responsive to said means for determining translation and rotation misalignment errors, for determining complete four-fold rotationally symmetric distortion between the two-dimensional array of stage positions and the Cartesian coordinate grid from the translation and rotation misalignment errors and the measured locations of the marks in the origin, rotated and translated reference locations.

47. The apparatus of claim 46, wherein said means for determining a two-dimensional translation misalignment error and a rotation misalignment error comprises determining a two-dimensional translation misalignment error and a rotation misalignment error based on differences between the complete non-four-fold rotationally symmetric distortion and the incomplete non-four-fold rotationally symmetric distortion.

* * * * *